(12) United States Patent
Hsieh

(10) Patent No.: US 10,396,058 B2
(45) Date of Patent: Aug. 27, 2019

(54) LIGHT-EMITTING DEVICE

(71) Applicant: EPISTAR CORPORATION, Hsinchu (TW)

(72) Inventor: Min-Hsun Hsieh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/443,605

(22) Filed: Feb. 27, 2017

(65) Prior Publication Data

US 2017/0179086 A1    Jun. 22, 2017

Related U.S. Application Data

(63) Continuation of application No. 14/640,642, filed on Mar. 6, 2015, now Pat. No. 9,583,469.

(Continued)

(51) Int. Cl.

| | |
|---|---|
| *H01L 25/07* | (2006.01) |
| *H01L 25/075* | (2006.01) |
| *H01L 25/13* | (2006.01) |
| *H01L 33/62* | (2010.01) |
| *H01L 23/00* | (2006.01) |
| *H01L 27/15* | (2006.01) |
| *F21K 9/232* | (2016.01) |

(Continued)

(52) U.S. Cl.
CPC .......... *H01L 25/0753* (2013.01); *F21K 9/232* (2016.08); *F21K 9/66* (2016.08); *H01L 24/81* (2013.01); *H01L 24/95* (2013.01); *H01L 25/13* (2013.01); *H01L 27/153* (2013.01); *H01L 33/62* (2013.01); *F21Y 2103/10* (2016.08); *F21Y 2107/00* (2016.08); *F21Y 2115/10* (2016.08); *H01L 2224/48091* (2013.01); *H01L 2224/48137* (2013.01); *H01L 2224/81001* (2013.01); *H01L 2224/81805* (2013.01); *H01L 2924/12042* (2013.01)

(58) Field of Classification Search
CPC ............................................... H01L 224/81001
See application file for complete search history.

(56) References Cited

U.S. PATENT DOCUMENTS

| | | |
|---|---|---|
| 6,523,978 B1 | 2/2003 | Huang |
| 7,834,424 B2 | 11/2010 | Peumans et al. |

(Continued)

FOREIGN PATENT DOCUMENTS

| | | |
|---|---|---|
| CN | 102446948 A | 5/2012 |
| JP | 3075689 U | 2/2001 |

(Continued)

*Primary Examiner* — Fernando L Toledo
*Assistant Examiner* — Valerie N Newton
(74) *Attorney, Agent, or Firm* — Muncy, Geissler, Olds & Lowe, P.C.

(57) ABSTRACT

A light-emitting device configured to electrically connect to an external circuit and having: a first light-emitting structure; a second light-emitting structure; a first conductive structure having a first connecting pad having a side surface and a top surface connected to the first light-emitting structure and an exposed bottom surface, and a first connecting portion extending away from the side surface without being directly connected to the second light-emitting structure; and a second conductive structure electrically connecting the first light-emitting structure and second light-emitting structure.

20 Claims, 26 Drawing Sheets

Related U.S. Application Data

(60) Provisional application No. 61/948,917, filed on Mar. 6, 2014.

(51) Int. Cl.
  *F21K 9/66* (2016.01)
  *F21Y 103/10* (2016.01)
  *F21Y 115/10* (2016.01)
  *F21Y 107/00* (2016.01)

(56) References Cited

U.S. PATENT DOCUMENTS

| | | |
|---|---|---|
| 8,471,387 B2 | 6/2013 | Huang |
| 8,484,836 B2 | 7/2013 | Lanzara et al. |
| 8,629,353 B2 | 1/2014 | Dinyari et al. |
| 9,583,469 B2 * | 2/2017 | Hsieh ............ H01L 25/13 |
| 9,966,504 B2 | 5/2018 | Konishi et al. |
| 2002/0094701 A1 * | 7/2002 | Biegelsen ............ B25J 13/084 439/32 |
| 2009/0317639 A1 * | 12/2009 | Axisa ............ B32B 37/185 428/411.1 |
| 2010/0096646 A1 | 4/2010 | Jeong |
| 2010/0219432 A1 | 9/2010 | Kim et al. |
| 2011/0140078 A1 | 5/2011 | Hsu |
| 2012/0051005 A1 | 3/2012 | Vanfleteren et al. |
| 2012/0056217 A1 * | 3/2012 | Jung ............ H01L 25/0753 257/89 |
| 2014/0048824 A1 | 2/2014 | Hsieh |
| 2014/0231857 A1 * | 8/2014 | Nammalwar ........ C09K 11/617 257/98 |

FOREIGN PATENT DOCUMENTS

| | | |
|---|---|---|
| JP | 2012231018 | 11/2012 |
| TW | 201440200 A | 10/2014 |
| WO | WO2010/018426 A2 | 2/2010 |

* cited by examiner

LIGHT-EMITTING DEVICE

CROSS-REFERENCE TO RELATED APPLICATIONS

This application is a continuation of co-pending application Ser. No. 14/640,642, filed on Mar. 6, 2015, for which priority is claimed under 35 U.S.C. § 120; and this application claims priority of U.S. provisional application No. 61/948,917 filed on Mar. 6, 2014 under 35 U.S.C. § 119(e), the entire contents of all of which are hereby incorporated by reference.

BACKGROUND OF THE INVENTION

Field of the Invention

The present disclosure relates to a light-emitting device and in particular to a light-emitting device with a stretchable connecting portion.

Brief Description of the Related Art

The light-emitting diodes (LEDs) of the solid-state lighting elements have the characteristics of low power consumption, low heat generation, long operational life, shockproof, small volume, quick response and good optoelectrical property like light emission with a stable wavelength so the LEDs have been widely used in household appliances, indicator light of instruments, and optoelectrical products, etc.

Recently, LED filament is developed to replace the wire filament used in a conventional incandescent light bulb. However, the LED filament still has cost and efficiency issues.

SUMMARY OF THE INVENTION

The present disclosure provides a light-emitting device.

The light-emitting device is configured to electrically connect to an external circuit and comprises: a first light-emitting structure; a second light-emitting structure; a first conductive structure comprising a first connecting pad having a side surface and a top surface connected to the first light-emitting structure, and a first connecting portion extending from the side surface and connected to the external circuit; and a second conductive structure electrically connecting the first light-emitting structure with the second light-emitting structure.

BRIEF DESCRIPTION OF THE DRAWINGS

The accompanying drawings are included to provide easy understanding of the application, and are incorporated herein and constitutes a part of this specification. The drawings illustrate the embodiments of the application and, together with the description, serves to illustrate the principles of the application.

DETAILED DESCRIPTION OF THE PREFERRED EMBODIMENTS

To better and concisely explain the disclosure, the same name or the same reference number given or appeared in different paragraphs or figures along the specification should has the same or equivalent meanings while it is once defined anywhere of the disclosure.

The following shows the description of embodiments of the present disclosure in accordance with the drawings.

Figure 1A:
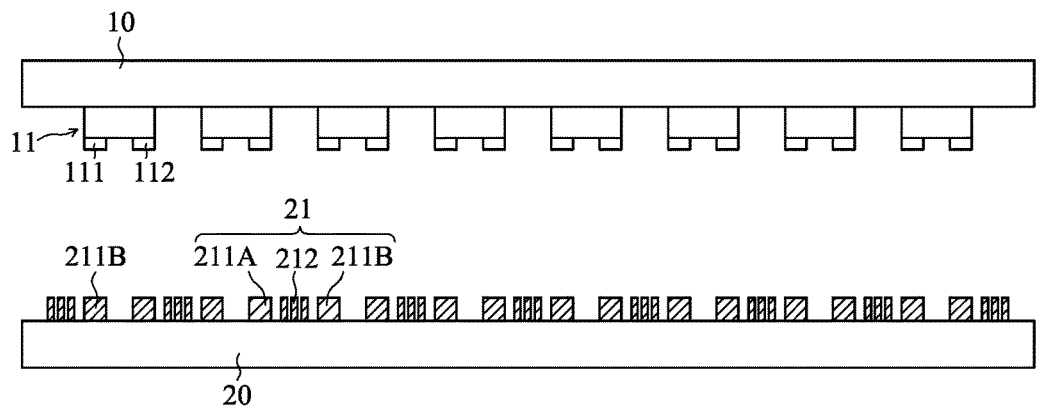
FIGS. 1A-1F are cross-sectional views of making a light-emitting device in accordance with the first embodiment of the present disclosure.

FIGS. 1A-1F are cross-sectional views of making a light-emitting device 100 in accordance with the first embodiment of the present disclosure. As shown in FIG. 1A, a plurality of light-emitting structures 11 is mounted on a first carrier 10. Each of the light-emitting structures 11 has a first bonding pad 111 (p_pad) and a second bonding pad 112 (n_pad). The first carrier 10 can be a temporary substrate (ex. blue tape, thermal release sheet or tape, UV release tape or polyethylene terephthalate (PET)) for temporarily connecting to the light-emitting structures 11 during making the light-emitting device 100, or a permanent substrate which is always connected to the light-emitting structures 11 during making the light-emitting device 100. In this embodiment, the first carrier 10 can be stretchable.

A second carrier 20 is provided and a plurality of conductive structures 21 is formed on the second carrier 20. The second carrier 20 comprises glass, sapphire, carbon graphene, ITO, carbon nanotube, poly(3,4-ethylenedioxythiophene)(PEDOT)-based material, tin oxide, zinc oxide, or other selected transparent material.

As shown also in FIG. 1A, each of the conductive structures 21 has a first connecting pad 211A, a second connecting pad 211B and a connecting portion 212. The connecting portion 212 is arranged between and electrically connects the first connecting pad 211A with the second connecting pad 211B. The conductive structures 21 are spaced apart from each other. In other words, the first connecting pad 211A of one conductive structure 21 is adjacent to and spaced apart from the second connecting pad 211B of another conductive structure 21.

Figure 1B:
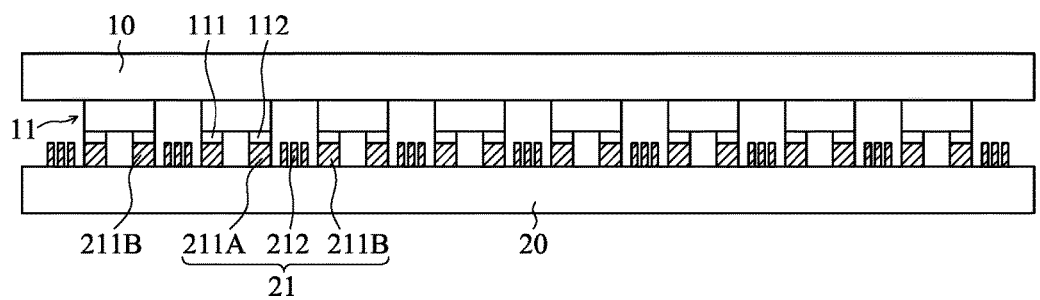

As shown in FIG. 1B, the conductive structures 21 are bonded to the light-emitting structures 11. Specifically, the first bonding pad 111 of the light-emitting structure 11 is physically bonded to the second connecting pad 211B of one conductive structure 21; and the second bonding pad 112 of the light-emitting structure 11 is physically bonded to the first connecting pad 211A of an adjacent conductive structure 21; such that a plurality of light-emitting structures 11 mounted thereon are electrically connected with each other. In this embodiment, the light-emitting structures 11 are electrically connected with each other in series. In addition, a light-emitting structure 11 is mounted on two conductive structures 21, or a conductive structure 21 is functioned as a bridge connecting two light-emitting structures 11. The connecting pads 211A, 211B can be connected to the bonding pads 111, 112 by eutectic bonding (for example, one eutectic alloy is formed.) or solder bonding (for example, an intermetallic compound is formed.).

Figure 1C:
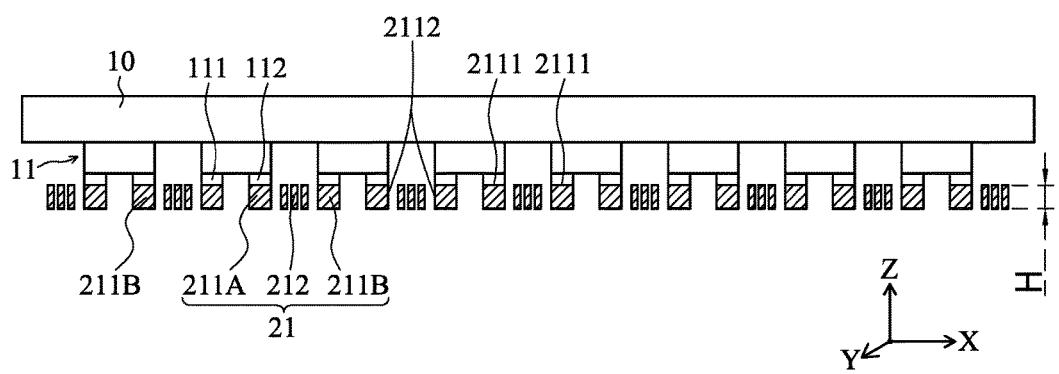

FIG. 1C shows that the second carrier 20 is removed by performing dry etching, wet etching, laser lift-off, heating or UV light. In one embodiment, when the second carrier 20 is made of glass, a solution of HF, or NaOH can be used to remove the glass. Optionally, a seed layer (not shown) can be formed between the conductive structures 21 and the second carrier 20. Therefore, when the seed layer is removed by the aforementioned etching method, the second carrier 20 can be separated from the conductive structures 21. Since the conductive structures 21 are bonded to the light-emitting structures 11, the conductive structures 21 have one side facing the light-emitting structure 11 and another side exposed to the ambient environment (for example, air), when the second carrier 20 is removed. Specifically, the connecting pads 211A, 211B of the conductive structures 21 have one side connected to the bonding pads 112, 111 and another side exposed to the ambient environment (for example, air or inert gas) and the connecting portion 212 of the conductive structures 21 has two side exposed to ambient environment (for example, air or inert gas).

The connecting portion 212 is made of an elastic material which can be stretchable. The connecting portion 212 has a spring-like shape, or has a characteristic of expanding or deforming under a well-controlled condition. Specifically, the connecting portion 212 maintains its deformed shape after expanding or compressing. The conductive structure 21 can be a single-layer or multi-layer structure which is made of one or more metallic materials. The metallic material can be chosen from Cu, Au, Pt, Ti, Ni, or an alloy thereof. Different from wire bonding for connecting two light-emitting structures, the conductive structure 21 are formed by physical vapor deposition (sputtering or evaporation), chemical vapor deposition, or electroplating for connecting two light-emitting structures 11. Therefore, the first connecting pad 211A, the second connecting pad 211B and the connecting portion 212 substantially are positioned at a height level (at a X-Y plane) and have non-circle cross-sections (Y-Z plane). In addition, the connecting portion 212 extends between the first connecting pad 211A and the second connecting pad 211B in the X direction and does not overlap the first connecting pad 211A and the second connecting pad 211B in the Z direction. In other words, each of the first connecting pad 211A and the second connecting pad 211B has a top surface 2111 and a side surface 2112, and the connecting portion 212 extends from the side surface 2112 of the first connecting pad 211A to the side surface 2112 of the second connecting pad 211B. Moreover, the first connecting pad 211A and the second connecting pad 211B substantially have a height same as that of the connecting portion 212. The height (H) of the first connecting pad 211A, the second connecting pad 211B and the connecting portion 212 are about 15-30 μm. In FIGS. 1A-1C, the connecting portion 212 is not stretched and the conductive structure 21 is shown in a first state.

In another embodiment, the conductive structure 21 can be a thermal-radiation material having emissivity larger than 0.7 for increasing heat dissipation by radiation. Alternatively, another thermal-radiation material can be coated on a surface of the conductive structure 21. The thermal-radiation material comprises carbon-containing compound such as SiC, graphene, metal oxide such as ZnO, or III-nitride compound such as BN.

Figure 1D:
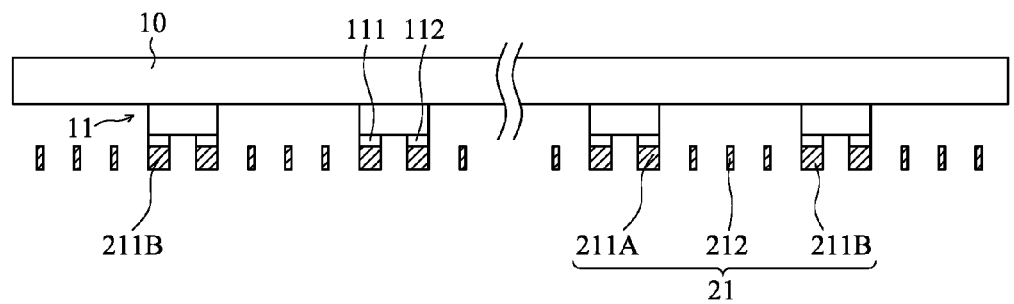

As shown in FIG. 1D, the first carrier 100 is stretched to increase the distances or pitches between the light-emitting structures 11. Since the connecting portion 212 is not boned to the light-emitting structure 11, the connecting portion 212, which is also stretchable, is therefore stretched with the first carrier 10. In this embodiment, the connecting portion 212 is stretched and the conductive structure 21 is shown in a second state which is a stretched state. Compared to the first state as shown in FIGS. 1A-1C, the distance or pitch between two adjacent light-emitting structures 11 is enlarged and the connecting portion 212 is deformed.

The ratio (R) of the distance or pitch between two adjacent light-emitting structures 11 after stretching (as shown in FIG. 1D) to that before stretching (as shown in FIGS. 1A-1C) is between 1 and 10. In other embodiment, $1 < R \leq 4$, preferably, $1.5 \leq R \leq 2$.

Figure 1E:
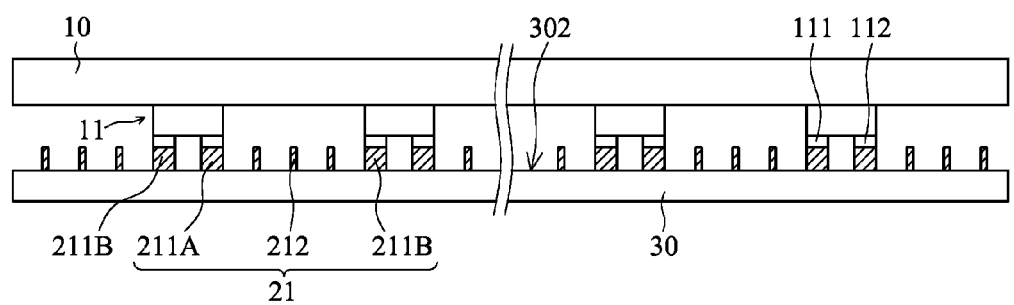

As shown in FIG. 1E, a third carrier 30 is provided to attach to the side of the conductive structures 21 exposed to the ambient environment for enhancing mechanical strength. Since the light-emitting structures 11 are electrically connected with each other by the conductive structures 21, the third carrier 30 is not required to include any traces formed thereon. The conductive structures 21 are formed on a topmost surface 302 of the third carrier 30. In addition, due to the manufacturing process, the connecting pad 211A, 211B are directly attached to the third carrier 30, but the connecting portion 211 may not be directly attached to the third carrier 30. Since the connecting portion 211 has one side not boned to the light-emitting structure 11 and the other side not attached to the third carrier 30, the connecting portion 211 has two sides not connected to any object and therefore is suspended in the air. The third carrier 30 can be made of metal (ex. Al, Cu, Fe), metal oxide, or ceramic material (ex. AlN, $Al_2O_3$), for facilitating dissipating heat from the light-emitting structures 11. In this embodiment, the third carrier 30 entirely covers the light-emitting structures 11 or covers all the light-emitting structures 11.

Figure 1F:
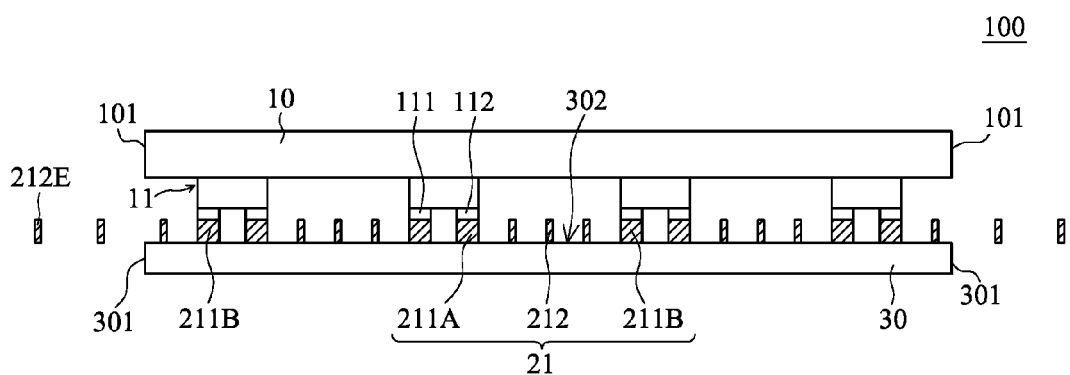

As shown in FIG. 1F, the structure of FIG. 1E is then divided into several light-emitting devices 100 (one light-emitting device is shown) by cutting the first carrier 10, the third carrier 30 and the connecting portions 212. Subsequently, the connecting portions 212E at two opposite ends of the light-emitting device 100 are drawn to extend beyond the edges 101 of the first carrier 10 or/and the edges 301 of the third carrier 30. Furthermore, the connecting portion 212E can be used as terminals to directly and electrically connect to other device (ex. a circuit, power supply or PCB board).

Figure 2A:
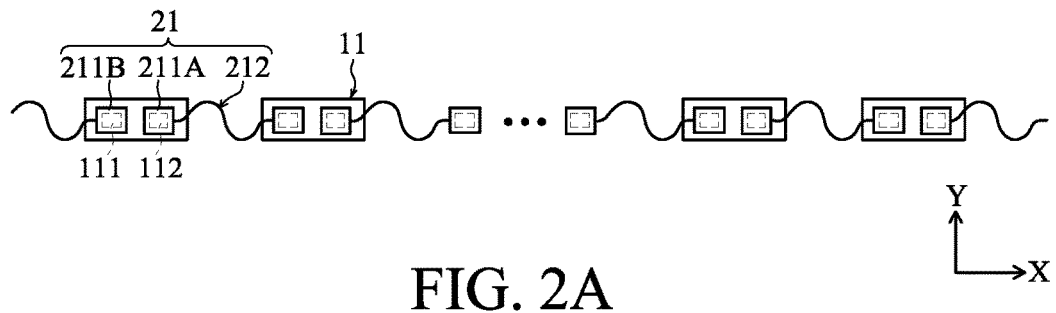
FIG. 2A is a bottom view of FIG. 1B.
Figure 2B:
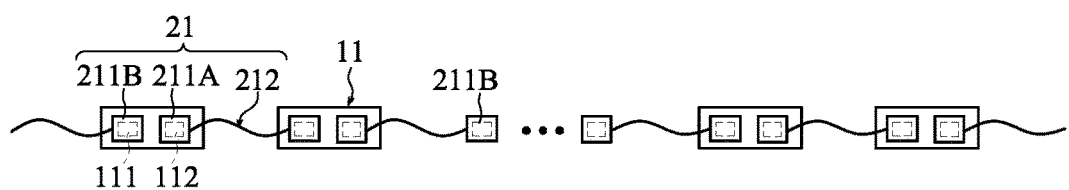
FIG. 2B is a bottom view of FIG. 1D.
Figure 2C:
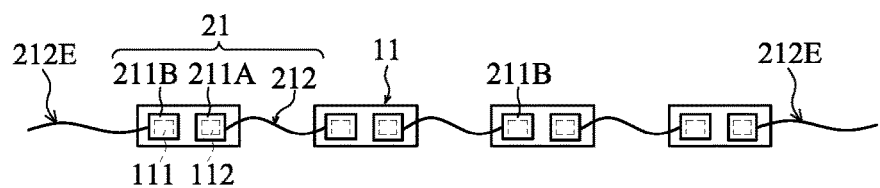
FIG. 2C is a bottom view of FIG. 1F.

FIGS. 2A to 2C are bottom views of FIGS. 1B, 1D and 1F, respectively, seen from the second carrier side, and shows a portion of the light-emitting structures 11 bonded to the conductive structures 21. For clearly showing the conductive structures 21, the first carrier 10 and the second carrier 20 are not shown. The connecting pad 211A or 211B has an area which is larger than that of the corresponding bonding pad 112 or 111. In other embodiment, the connecting pad 211A or 211B has an area which is equal to, or smaller than that of the corresponding bonding pad 112 or 111. Moreover, the connecting portion 212 has a width smaller than those of the first connecting pad 211A and the second connecting pad 211B in the Y direction. The width of the connecting portion 212 is about 1-15 µm. The material of the connecting portion 212 can be the same as or different from that of the connecting pad 211A, 211B. In addition, a shape of the first connecting pad 211A and the second connecting pad 211B is a square but not to limit to be a circle, a triangle, a rectangle or a polygon depending on desired requirements in a plan view. The first connecting pad 211A can have the same or different shape from the second connecting pad 211B. A relative position or a distance between the first connecting pad 211A and the second connecting pad 211B can be varied depending on desired requirements.

FIGS. 3A-3F are cross-sectional views of making a light-emitting device 200 in accordance with the second embodiment of the present disclosure. The process of FIGS. 3A-3D can correspond to FIGS. 1A-1D where devices or elements with similar or the same symbols represent those with the same or similar functions.

Figure 3A:
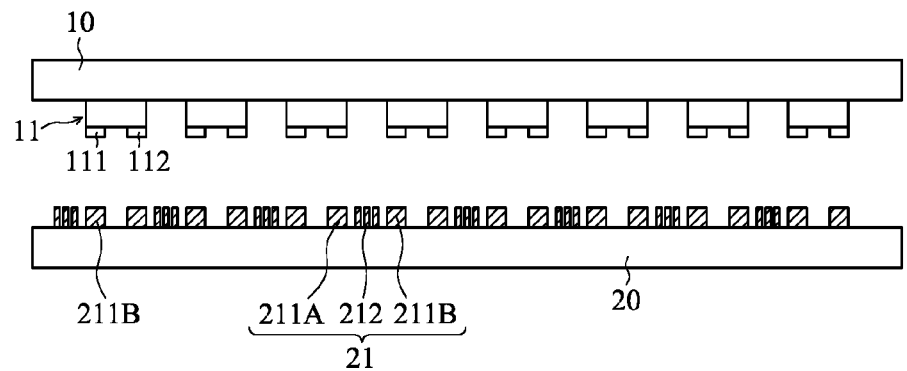
FIGS. 3A-3F are cross-sectional views of making a light-emitting device in accordance with the second embodiment of the present disclosure.
Figure 3B:
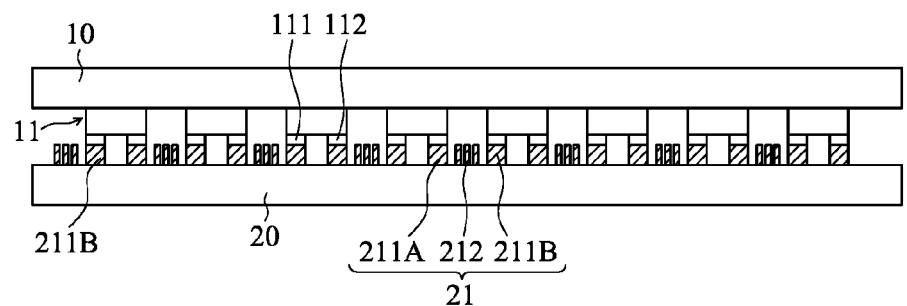
Figure 3C:
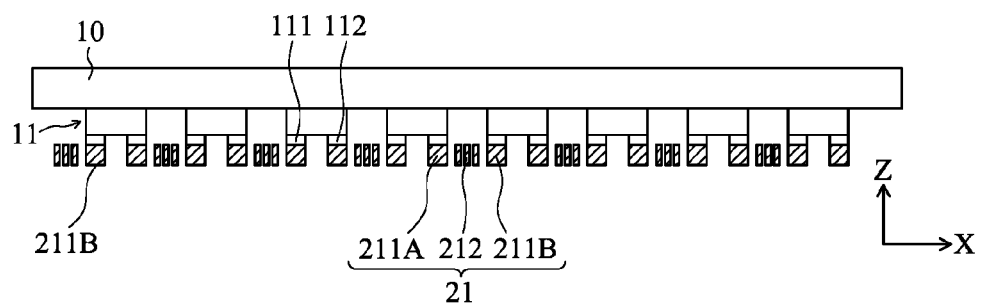
Figure 3D:
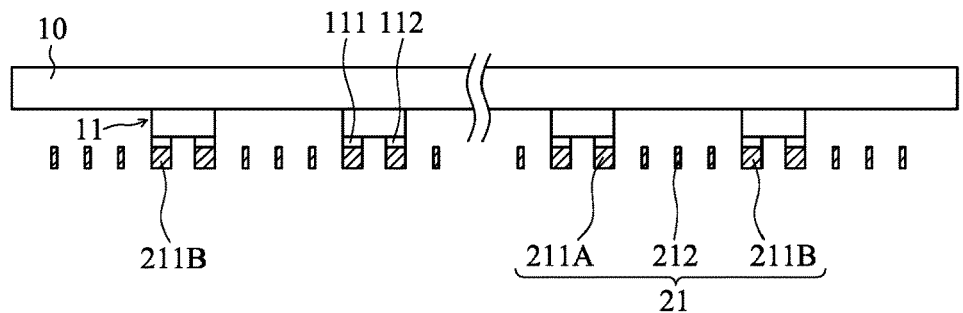
Figure 3E:
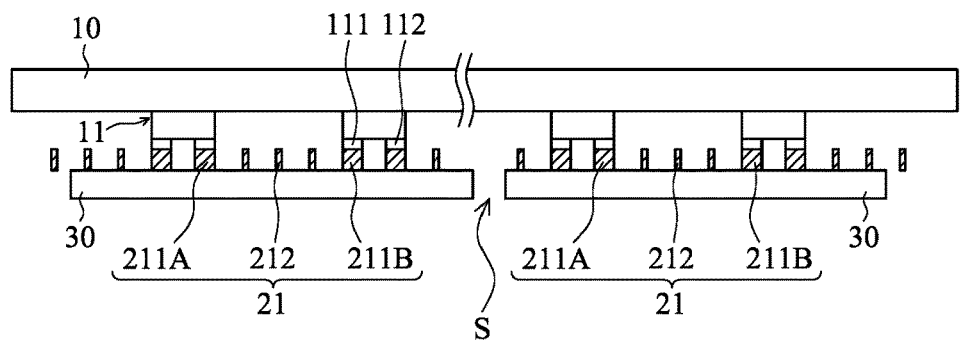

Subsequently, as shown in FIG. 3E, a plurality of discrete third carriers 30 is provided and attached to the side of the light-emitting structures 11 exposed to the ambient environment. Each of the third carriers 30 is attached to a portion of the light-emitting structures 11.

Figure 3F:
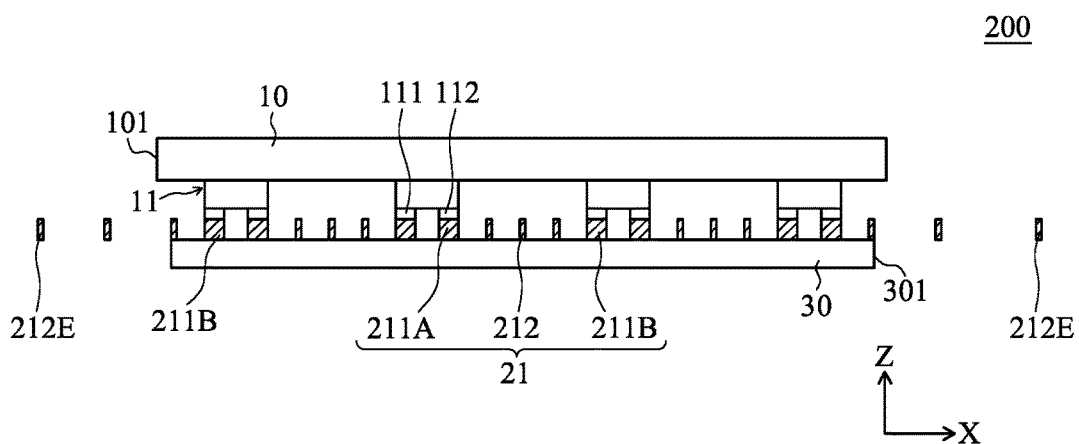

As shown in FIG. 3F, the structure of FIG. 3E is then divided into a plurality of light-emitting devices 200 (one light-emitting device is shown) by cutting the first carrier 10 and the connecting portion 212 at a position corresponding to a space S between two adjacent third carriers 30. In this embedment, the third carrier 30 in the light-emitting device 200 has a length (X direction) shorter than that of the first carrier 10. Likewise, the connecting portions 212E at two opposite ends of the light-emitting device 200 are drawn to extend beyond the edges 101 of the first carrier 10 or/and the edges 301 of the third carrier 30. The connecting portions 212E can be used as terminals to directly and electrically connect to other device (ex. a circuit, power supply or PCB board).

FIGS. 4A-4F are cross-sectional views of making a light-emitting device 200 in accordance with the third embodiment of the present disclosure. The process of FIGS. 4A-4D can correspond to FIGS. 1A-1D where devices or elements with similar or the same symbols represent those with the same or similar functions.

Figure 4A:
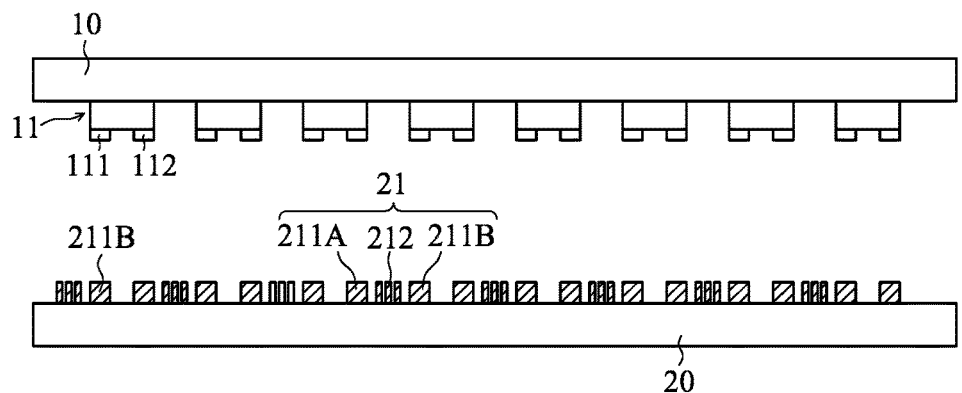
FIGS. 4A-4F are cross-sectional views of making a light-emitting device in accordance with the third embodiment of the present disclosure.
Figure 4B:
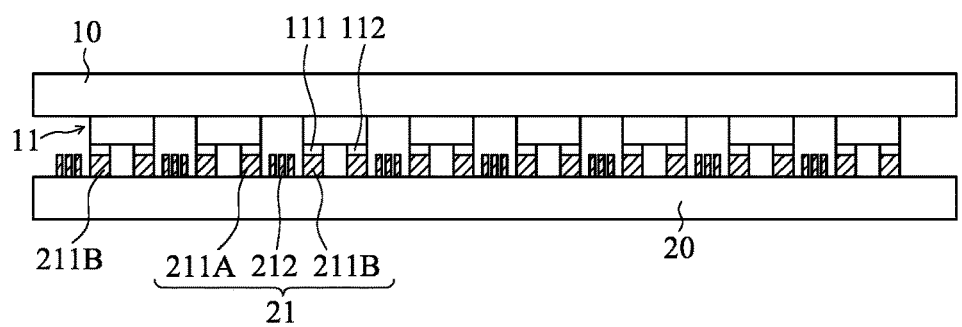
Figure 4C:
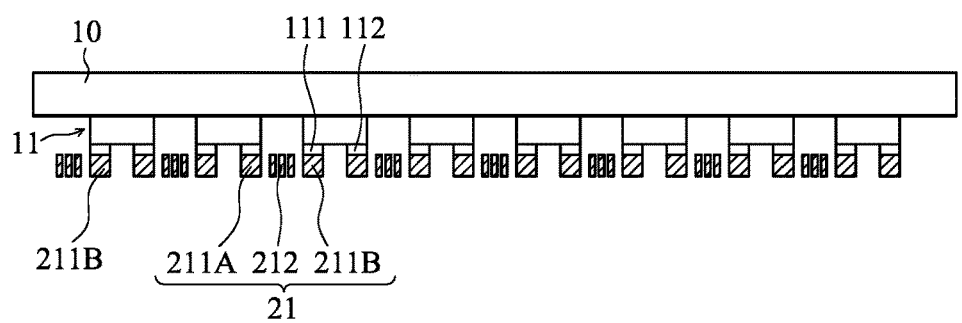
Figure 4D:
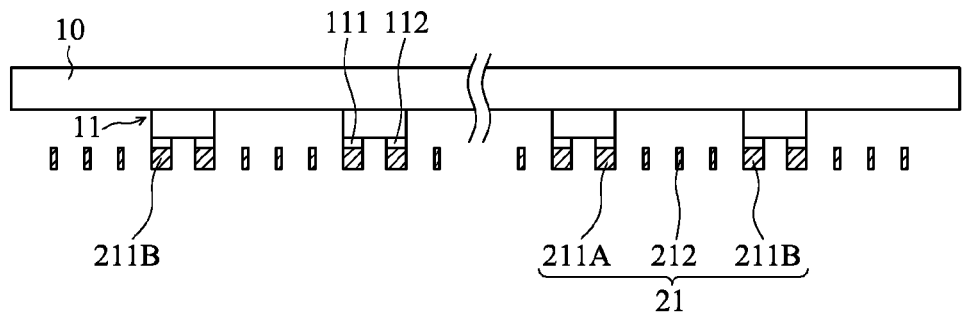
Figure 4E:
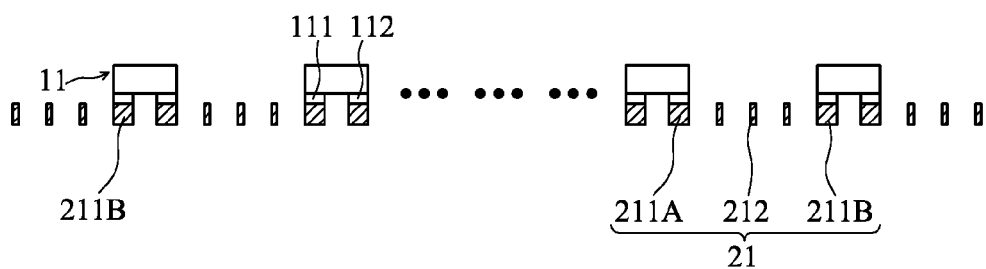
Figure 4F:
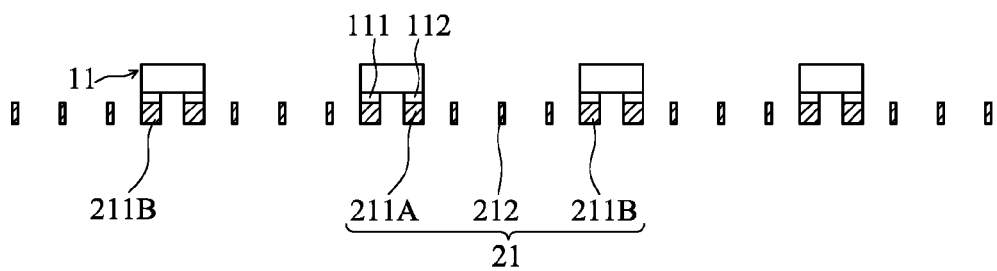

Subsequently, as shown in FIG. 4E, the first carrier 10 is further removed which can be performed by dry etching, wet etching, laser lift-off, heating or UV light. As shown in FIG. 4F, the structure of FIG. 4E is divided into a plurality of light-emitting devices 300 (one light-emitting device is shown) by cutting the connecting portions 212. Optionally, the first carrier 10 can be removed after the dividing step. Likewise, the connecting portions 212E at two opposite ends of the light-emitting device 300 can be used as terminals to directly and electrically connect to other device (ex. a circuit, power supply or PCB board). In this embodiment, the light-emitting device 300 is free of any carrier.

FIGS. 5A-5G are cross-sectional views of making a light-emitting device 400 in accordance with the fourth embodiment of the present disclosure. The process of FIGS. 5A-5E can correspond to FIGS. 1A-1E where devices or elements with similar or the same symbols represent those with the same or similar functions.

Figure 5A:
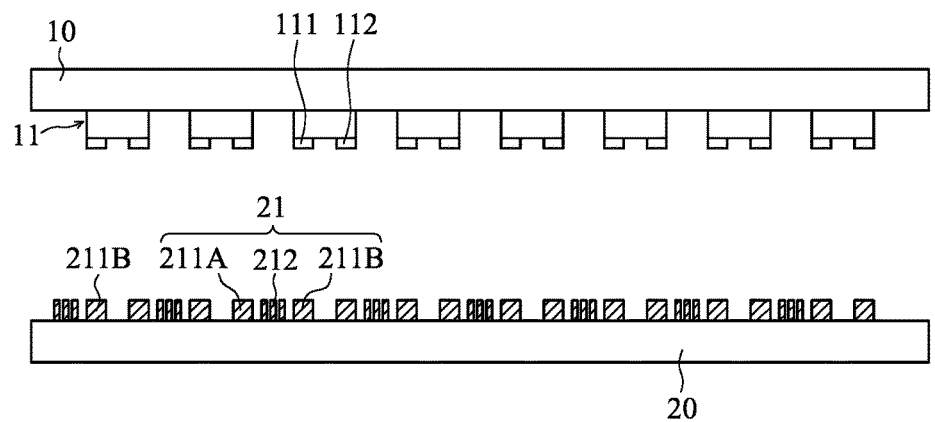
FIGS. 5A-5G are cross-sectional views of making a light-emitting device in accordance with the fourth embodiment of the present disclosure.
Figure 5B:
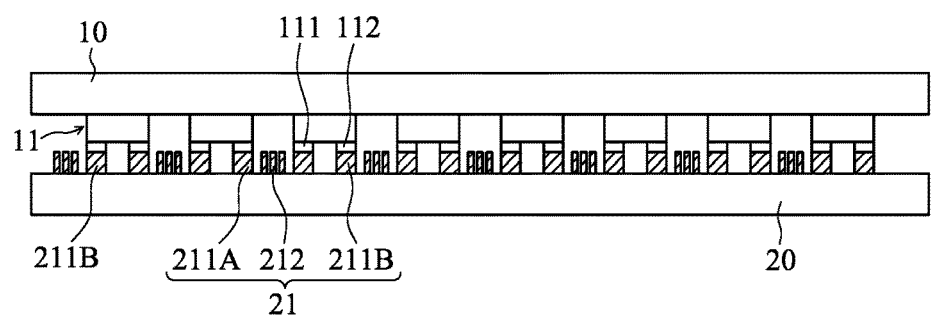
Figure 5C:
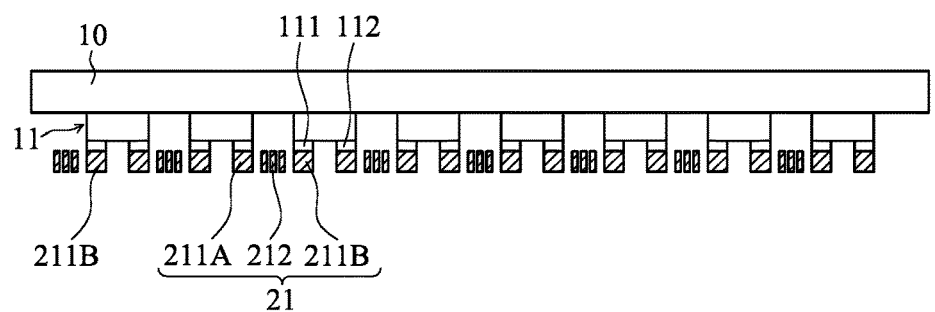
Figure 5D:
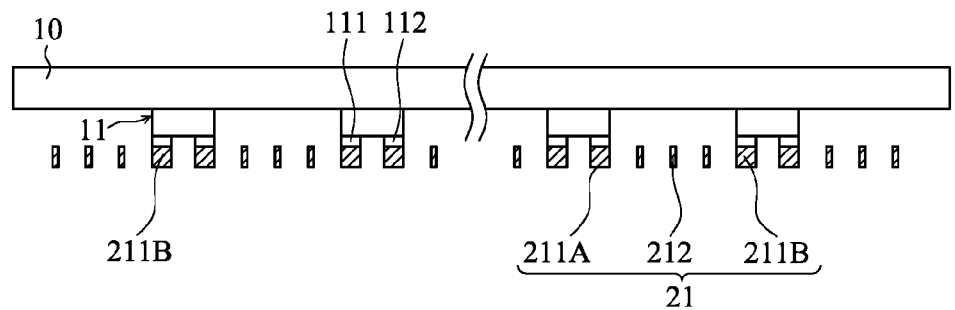
Figure 5E:
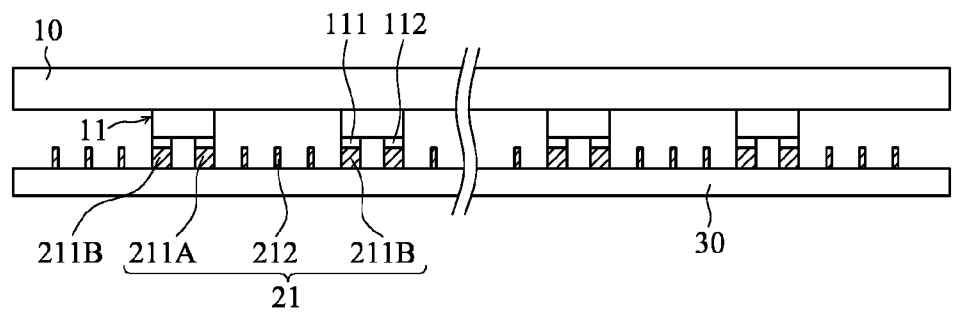
Figure 5F:
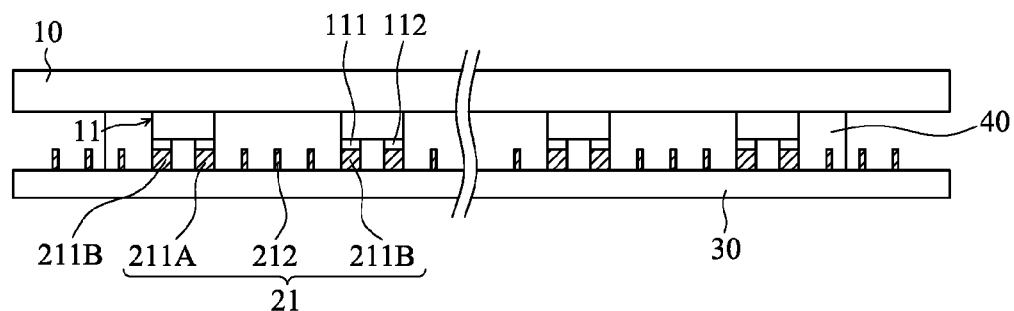

Subsequently, as shown in FIG. 5F, a transparent material 40 is provided to fill within a space between the first carrier 10 and the third carrier 30 to enclose the light-emitting structures 11 and a portion of the conductive structures 21 for facilitating heat dissipation. Optionally, one or more kinds of wavelength conversion material (not shown) or/and one or more kinds of diffusing material (not shown) can be added into the transparent material 40. The transparent material 40 can be formed by spraying, molding, or dispensing. The transparent material 40 comprises silicone or epoxy. The silicone can be a methyl-based silicone, a phenyl-based silicone, or a mixture of both. The wavelength conversion material can covert the light emitted from the light-emitting structures 11 to yellow light, yellowish green light, green light or red light. The wavelength conversion material emitting yellow light, yellowish green light, or green light comprises aluminum oxide (such as YAG or TAG), silicate, vanadate, alkaline-earth metal selenide, or metal nitride. The wavelength conversion material emitting red light comprises silicate, vanadate, alkaline-earth metal sulfide, metal nitride oxide, a mixture of tungstate and molybdate. The diffusing material comprises $TiO_2$, ZnO, $ZrO_2$, $Al_2O_3$.

Figure 5G:
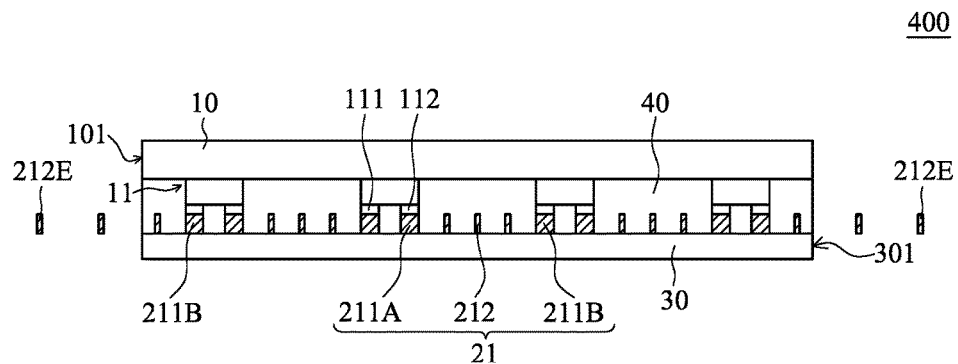

As shown in FIG. 5G, the structure of FIG. 5F is then divided into a plurality of light-emitting devices 400 (one light-emitting device is shown) by cutting the first carrier 10, the third carrier 30 and the connecting portions 212. Likewise, the connecting portions 212E at two opposite ends of the light-emitting device 400 are drawn to extend beyond the edges 101 of the first carrier 10 or/and the edges 301 of the third carrier 30 and therefore the transparent material 40 enclosed a portion of the connecting portions 212E. The connecting portion 212E can be used as terminals to directly and electrically connect to other device (ex. a circuit, power supply or PCB board).

Figure 5H:
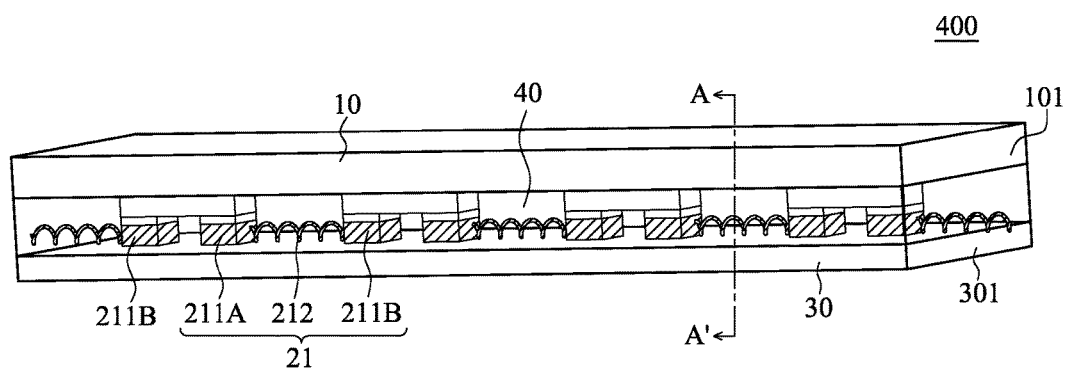
FIG. 5H shows a perspective view of FIG. 5G.
Figure 5I:
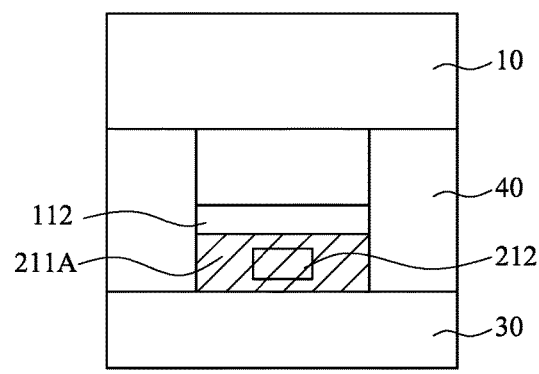
FIG. 5I is a cross-sectional view taken along line A-A of FIG. 5H.

FIG. 5H shows a perspective view of FIG. 5G. FIG. 5I is a cross-sectional view taken along line A-A of FIG. 5H. The light-emitting structures 11 and the conductive structure 21 are embedded within the transparent material 40. Accordingly, a sidewall of the connecting portion 212 is enclosed by the transparent material 40. The connecting portion 212 is embedded in the transparent material 40.

FIGS. 6A-6F are cross-sectional views of making a light-emitting device 500 in accordance with the fifth embodiment of the present disclosure. The process of FIGS. 6A-6D can correspond to FIGS. 1A-1D where devices or elements with similar or the same symbols represent those with the same or similar functions.

Figure 6A:
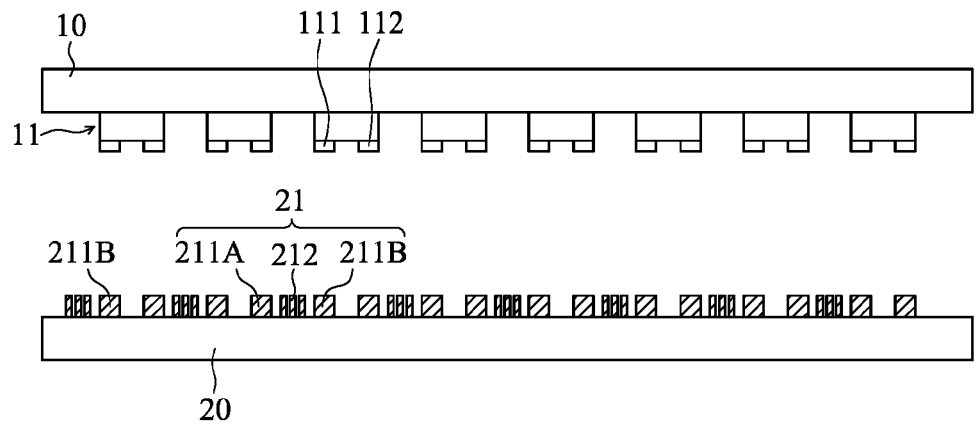
FIGS. 6A-6F are cross-sectional views of making a light-emitting device in accordance with the fifth embodiment of the present disclosure.
Figure 6B:
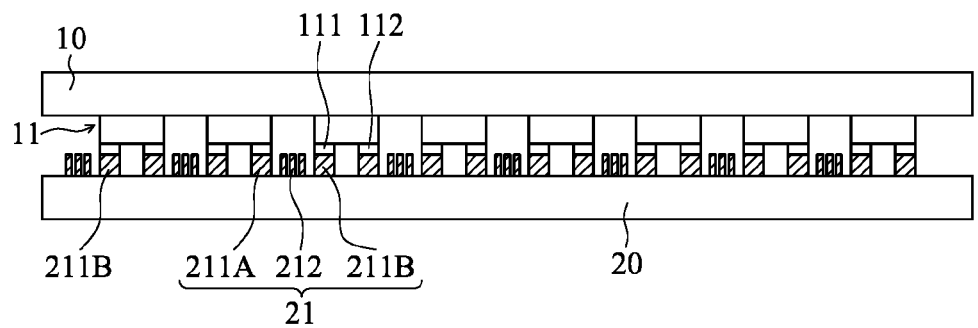
Figure 6C:
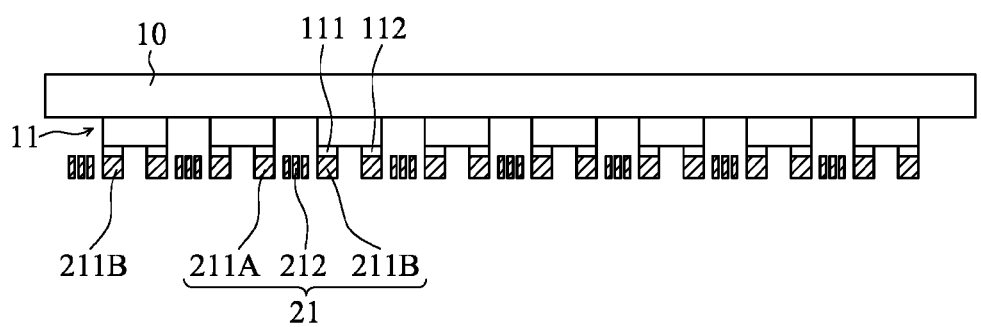
Figure 6D:
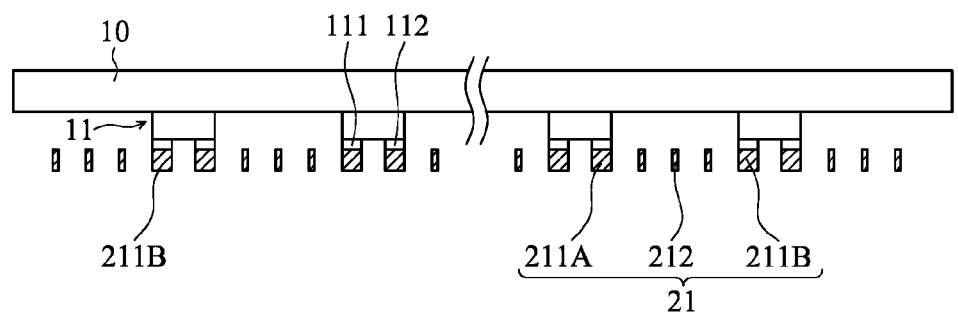
Figure 6E:
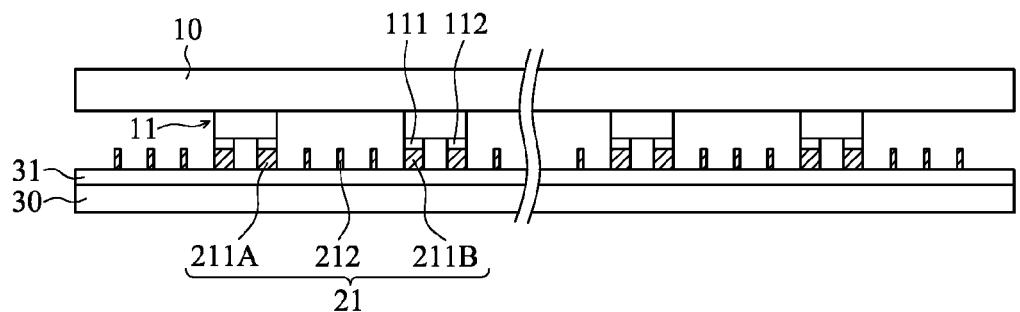

Subsequently, as shown in FIG. 6E, an adhesive layer 31 is formed on the third carrier 30. The third carrier 30 is bonded to the conductive structures 21 through the adhesive layer 31. The adhesive layer 31 comprises silicone or epoxy. The silicone can be a methyl-based silicone, a phenyl-based silicone, or a mixture of both.

Figure 6F:
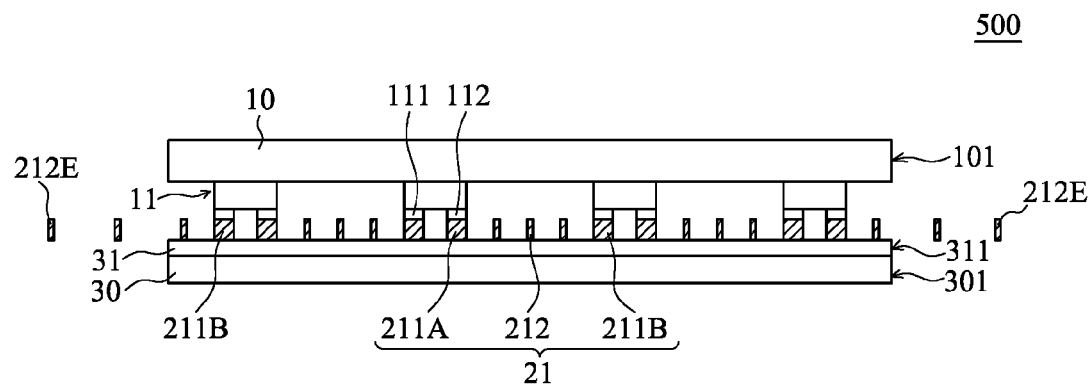

As shown in FIG. 6F, the structure of FIG. 6E is then divided into several light-emitting devices 500 (one light-emitting device is shown) by cutting the first carrier 10, the third carrier 30, the adhesive layer 31 and the connecting portions 212. Likewise, the connecting portions 212 at two opposite ends of the light-emitting device 500 can be drawn to extend beyond the edges 101 of the first carrier 10, the edges 301 of the third carrier 30 or/and the edges 311 the adhesive layer 31. The connecting portion 212E can be used as terminals to directly and electrically connect to other device (ex. a circuit, power supply or PCB board).

FIGS. 7A-7I are cross-sectional views showing a detail structure of the light-emitting structure described in the previous embodiments (first to fifth embodiments). The light-emitting structures of FIGS. 7A-7I are given new reference numerals 701-709, respectively.

Figure 7A:
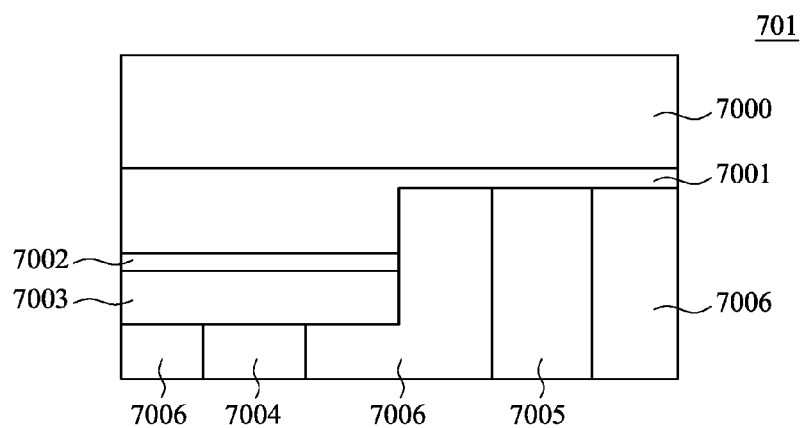
FIGS. 7A-7I are cross-sectional views showing a detail structure of a light-emitting structure.

As shown in FIG. 7A, the light-emitting structure 701 comprises a substrate 7000, a first-type semiconductor layer 7001, an active layer 7002, a second-type semiconductor layer 7003, a first electrode 7004 formed on the second-type semiconductor layer 7003 and a second electrode 7005 formed on the first-type semiconductor layer 7001. The first-type semiconductor layer 7001 and the second-type semiconductor layer 7003, for example, a cladding layer or a confinement layer, provide electrons and holes, respectively, such that electrons and holes can be recombined in the active layer 7002 to generate light. Optionally, a protection layer 7006 can cover the first-type semiconductor layer 7001 and the second-type semiconductor layer 7003, and can surround the first electrode 7004 and the second electrode 7005. When applied in the previous embodiments, the first electrode 7004 is used as the bonding pad 111 and the second electrode 7005 is used as the bonding pad 112. The protection layer 7006 comprises SiOx, SiNx, Al$_2$O$_3$, or silicone.

Figure 7B:
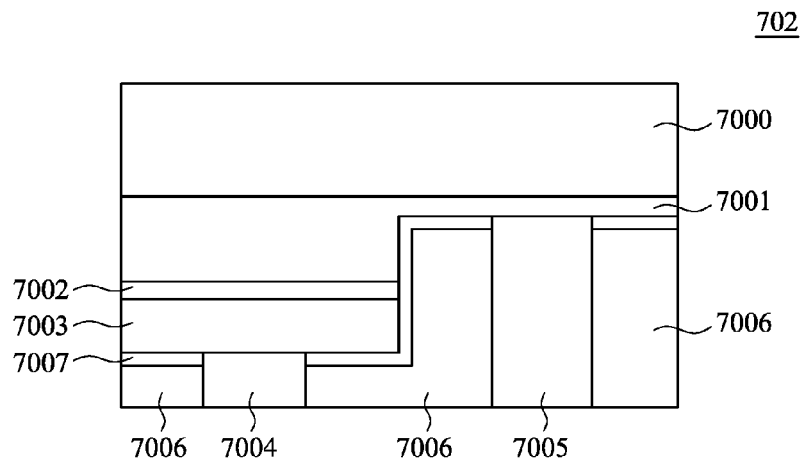

As shown in FIG. 7B, the light-emitting structure 702 has a structure similar to the light-emitting structure 701 but further comprises a reflective layer 7007 formed between the first-type semiconductor layer 7001 and the protection layer 7006, and between the second-type semiconductor layer 7003 and the protection layer 7006 for reflecting the light from the active layer 7002 toward the substrate 7000. The reflective layer 7007 can be a multilayer which is stack of alternate layers, each of which is one from the group consisting of Al$_2$O$_3$, SiO$_2$ TiO$_2$, and Nb$_2$O$_5$ to form a Distributed Bragg Reflector (DBR) structure.

Figure 7C:
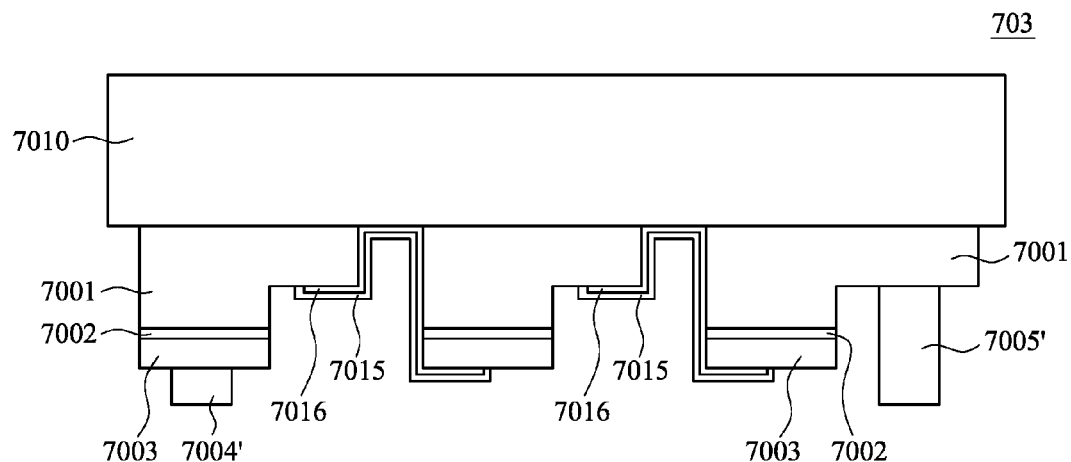

As shown in FIG. 7C, the light-emitting structure 703 comprises a common substrate 7010, a plurality of light-emitting stack on the common substrate 7010. Each of the light-emitting stacks comprises a first-type semiconductor layer 7001, an active layer 7002, and a second-type semiconductor layer 7003. In this embodiment, a first electrode 7004' formed on the second-type semiconductor layer 7003 of one light-emitting stack and a second electrode 7005' formed on the first-type semiconductor layer 7001 of another one light-emitting stack. An interconnecting structure 7015 is provided for electrically connecting two adjacent light-emitting stacks in series. Optionally, the light-emitting stacks can be connected with each other in a parallel connection, in an anti-parallel connection or in a Wheatstone bridge connection. An insulation layer 7016 is formed between the light-emitting stack and the interconnecting structure 7015 to avoid undesired electrical path. When applied in the previous embodiments, the first electrode 7004' is used as the bonding pad 111 and the second electrode 7005' is used as the bonding pad 112.

Figure 7D:
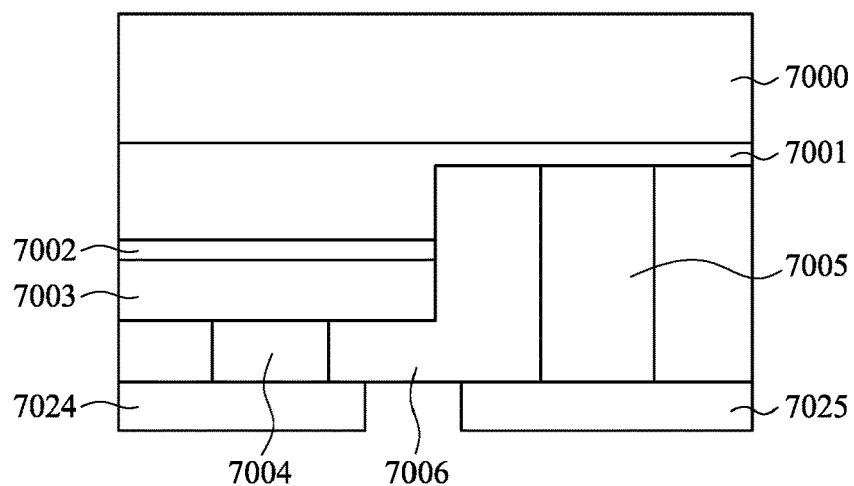

As shown in FIG. 7D, the light-emitting structure 704 has a structure similar to the light-emitting structure 701, but further comprises a first enlarged pad 7024 formed on the first electrode 7004 and the protection layer 7006, and a second enlarged pad 7025 formed on the second electrode 7005 and the protection layer 7006. The first enlarged pad 7024 and the second enlarged pad 7025 are physically separated from each other. The first enlarged pad 7024 and the second enlarged pad 7025 have an area (or width) larger than that of the first electrode 7004 and the second electrode 7005, respectively, for facilitating subsequent alignment process. When applied in the previous embodiments, the first electrode 7024 is used as the bonding pad 111 and the second electrode 7025 is used as the bonding pad 112.

Figure 7E:
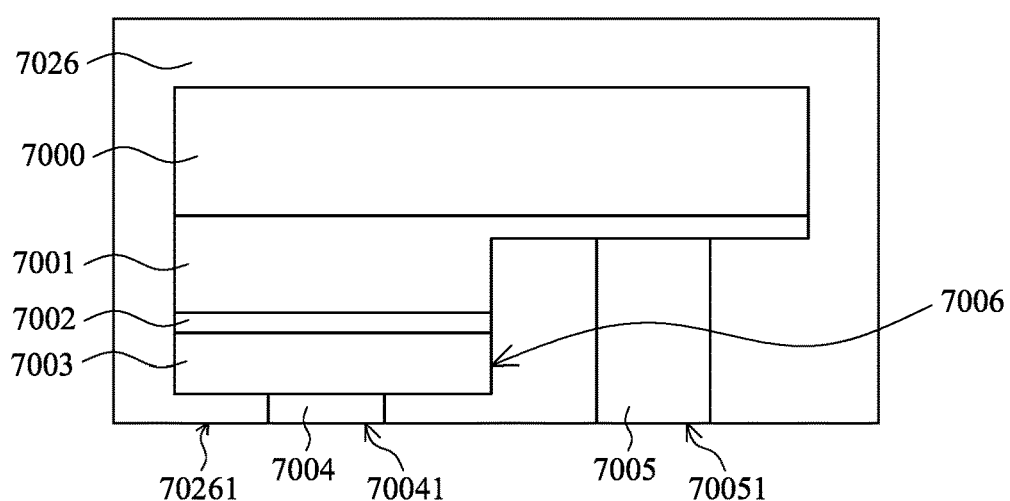

As shown in FIG. 7E, the light-emitting structure 704 has a structure similar to the light-emitting structure 701, but further has a first transparent structure 7026 surrounding and enclosing the first-type semiconductor layer 7001, the active layer 7002 and the second-type semiconductor layer 7003. A footprint area of the first transparent structure 7026 is larger than that of the substrate 7000. The first transparent structure 7026 has a surface 70261 substantially coplanar with a surface 70041 of the first electrode 7004 and a surface 70051 of the second electrode 7005. When applied in the previous embodiments, the first electrode 7004 is used as the bonding pad 111, and the second electrode 7005 is used as the bonding pad 112. The first transparent structure 7026 can be a transparent structure, primarily made of one or more of organic material and inorganic material. The organic material can be silicone, epoxy, polyimide (PI), BCB, perfluorocyclobutane (PFCB), Su8, acrylic resin, polymethyl methacrylate (PMMA), polyethylene terephthalate (PET), polycarbonate (PC), polyetherimide, or fluorocarbon polymer. The inorganic material can be glass, Al$_2$O$_3$, SINR, or SOG.

Figure 7F:
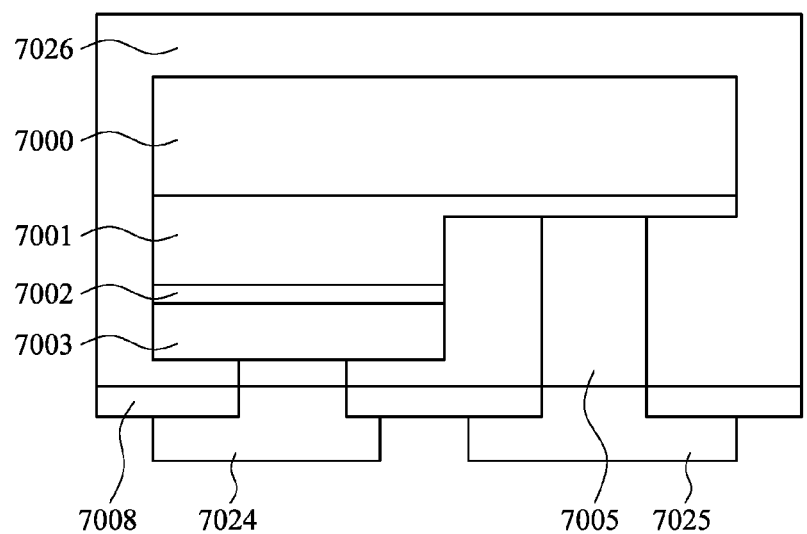

As shown in FIG. 7F, the light-emitting structure 706 has a structure similar to the light-emitting structure 705 but further comprises a first enlarged pad 7024 formed on the first electrode 7004 and the first transparent structure 7026 and a second enlarged pad 7025 formed on the second electrode 7005 and the first transparent structure 7026. The first enlarged pad 7024 and the second enlarged pad 7025 are physically separated from each other. A supporting layer 7008 is formed between the first enlarged pad 7024 and the first transparent structure 7026 and between the second enlarged pad 7025 and the first transparent structure 7026. When applied in the previous embodiments, the first electrode 7024 is used as the bonding pad 111 and the second electrode 7025 is used as the bonding pad 112. The supporting layer 7008 can comprise SiO$_2$, Si$_3$N$_4$, or metal oxide (such as titanium dioxide), metal (such as Al or Cu), silicone, epoxy, bismaleimide triazine (BT), polyimide resin, polytetrafluoroethylene, or ceramic material (such as Al$_2$O$_3$, AlN, or Al SiC).

Figure 7G:
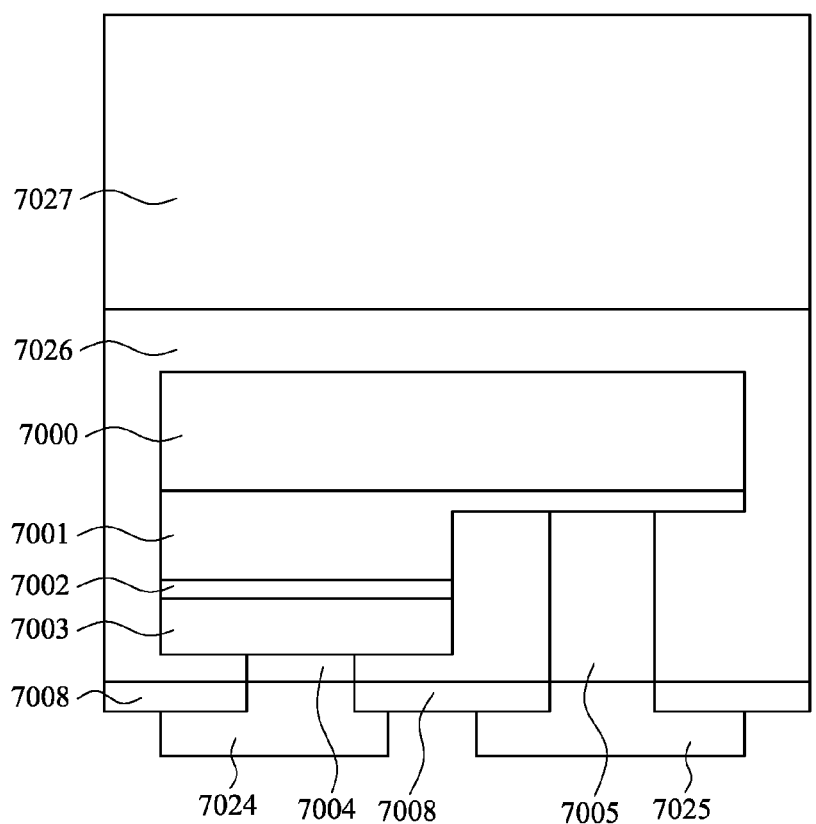

As shown in FIG. 7G, the light-emitting structure 707 has a structure similar to the light-emitting structure 706 but further comprises a second transparent structure 7027 formed on the first transparent structure 7026. The second transparent structure 7027 has a side surface substantially coplanar with a side surface of the first transparent structure 7026. When applied in the previous embodiments, the first electrode 7024 is used as the bonding pad 111 and the second electrode 7025 is used as the bonding pad 112.

Figure 7H:
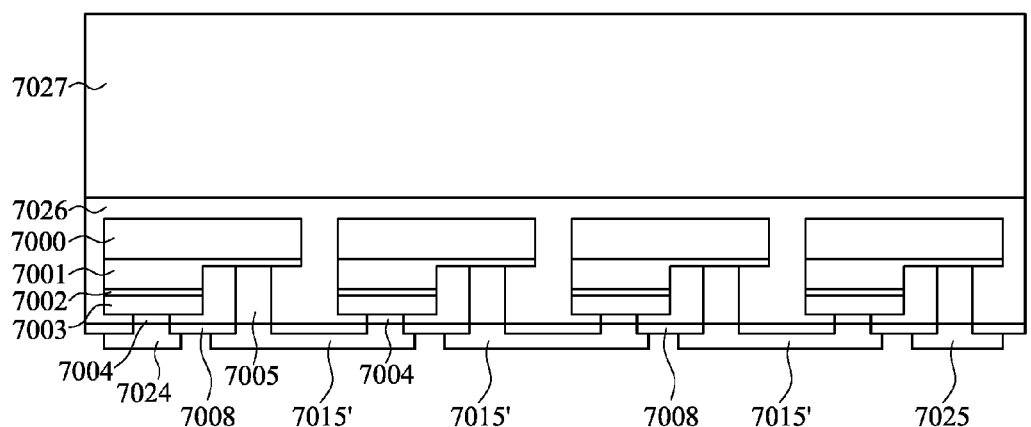

As shown in FIG. 7H, the light-emitting structure 708 has a plurality of spaced-apart light-emitting stacks. Each of the light-emitting stacks comprises a substrate 7000, a first-type semiconductor layer 7001, an active layer 7002, a second-type semiconductor layer 7003, a first electrode 7004 formed on the second-type semiconductor layer 7003 and a second electrode 7005 formed on the first-type semiconductor layer 7001. A first transparent structure 7026 is formed to cover and enclose all of the plurality of light-emitting stacks. A second transparent structure 7027 is formed on the first transparent structure 7026. The second transparent structure 7027 has a side surface substantially coplanar with a side surface of the first transparent structure 7026. The light-emitting unit 708 further comprises an interconnecting structure 7015' provided to electrically connect the light-emitting stacks with each other in series. In one embodiment, the light-emitting stacks can be electrically connected with each other in a parallel connection, in an anti-parallel connection or in a Wheatstone bridge connection. In addition, a supporting layer 7008 is formed between a first enlarged pad 7024 and the first transparent structure 7026 and between a second enlarged pad 7025 and the first transparent structure 7026. When applied in the previous embodiments, the first electrode 7024 is used as the bonding pad 111 and the second electrode 7025 is used as the bonding pad 112.

Figure 7I:
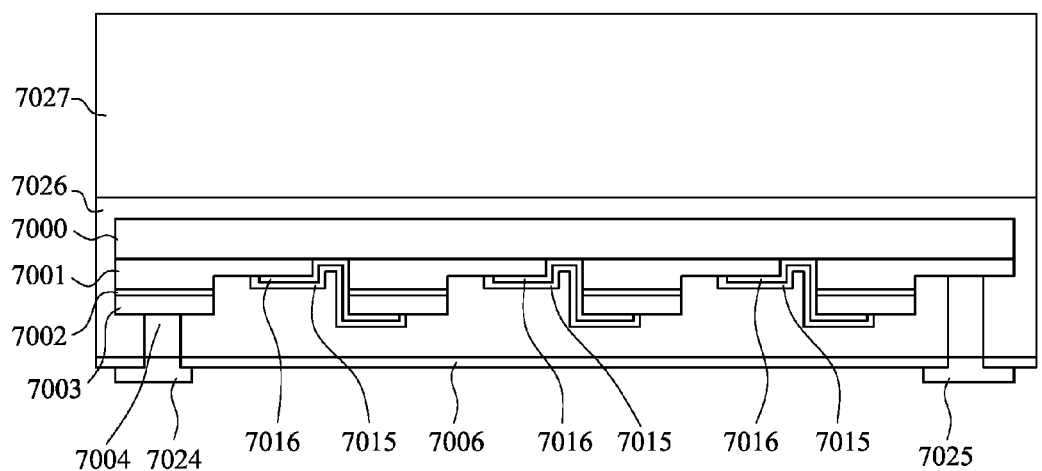

As shown in FIG. 7I, the light-emitting structure 709 has a structure similar to the light-emitting structure 708. The light-emitting structure 709 has a substrate 7000 and a plurality of spaced-apart light-emitting bodies commonly formed on the substrate 7000. Each of the light-emitting bodies includes a first-type semiconductor layer 7001, an active layer 7002, and a second-type semiconductor layer 7003. The first enlarged pad 7024 is physically formed only on one light-emitting body, and the second enlarged pad 7025 is physically formed only on another light-emitting body. In other words, portions of the light-emitting bodies do not contact the first enlarged pad 7024 and the second enlarged pad 7025.

FIGS. 8A-8J are cross-sectional views of making a light-emitting device 600 in accordance with the sixth embodiment of the present disclosure. As shown FIG. 8A, a plurality of spaced-apart light-emitting structure 704 are disposed on a composite substrate including a first substrate 23 and a second substrate 24. The first substrate 23 can be one of blue tape, thermal release tape/film and UV release tape. The second substrate 24 can be one of glass, sapphire, and AlN.

Figure 8A:
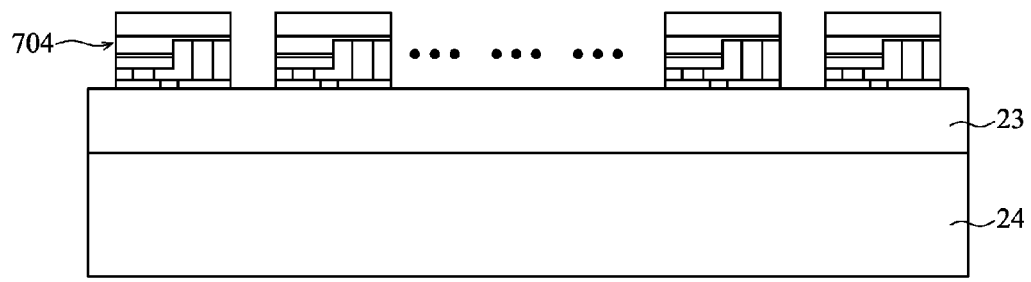
FIGS. 8A-8J are cross-sectional views of making a light-emitting device in accordance with the sixth embodiment of the present disclosure.
Figure 8B:
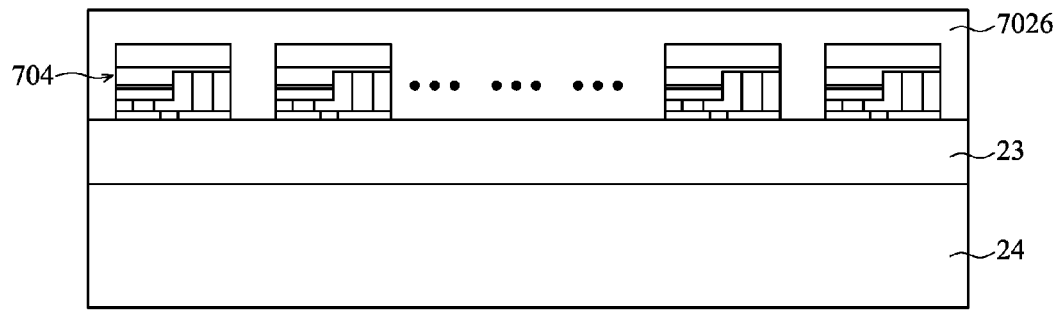

As shown in FIG. 8B, a transparent structure 7026 is provided to cover and enclose the light-emitting structures 704. All of the light-emitting structures 704 are not exposed to the ambient environment (for example, air or inert gas).

Figure 8C:
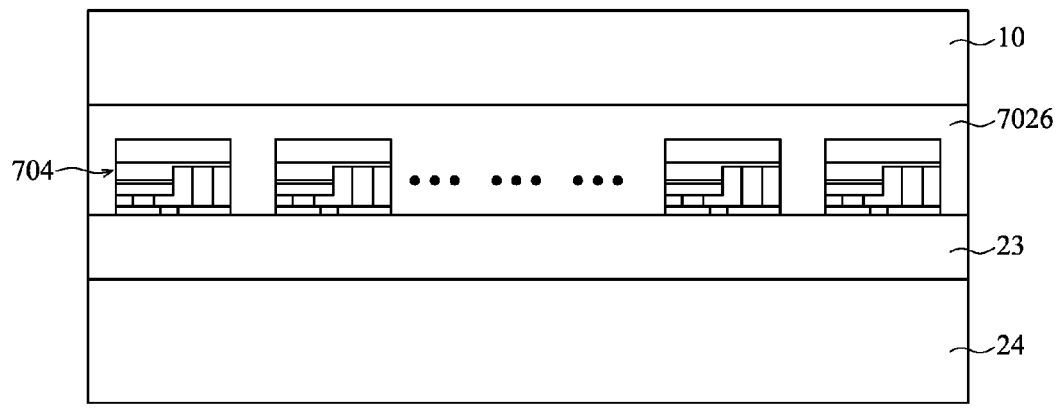

As shown in FIG. 8C, a first carrier 10 is attached to the transparent structure 7026.

Figure 8D:
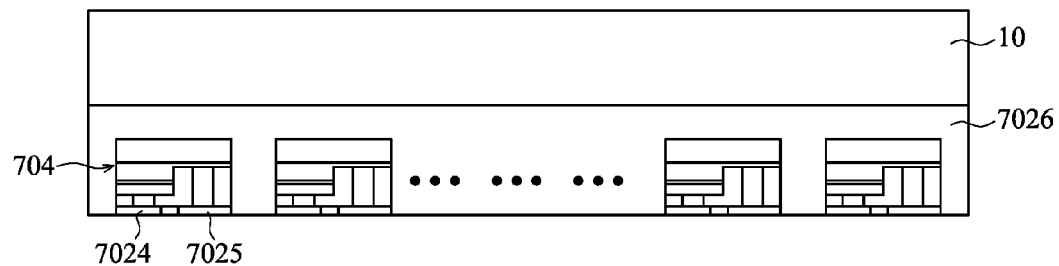

As shown in FIG. 8D, the composite substrate is removed to expose surfaces of the transparent structure 7026 and the electrodes 7024, 7025.

Figure 8E:
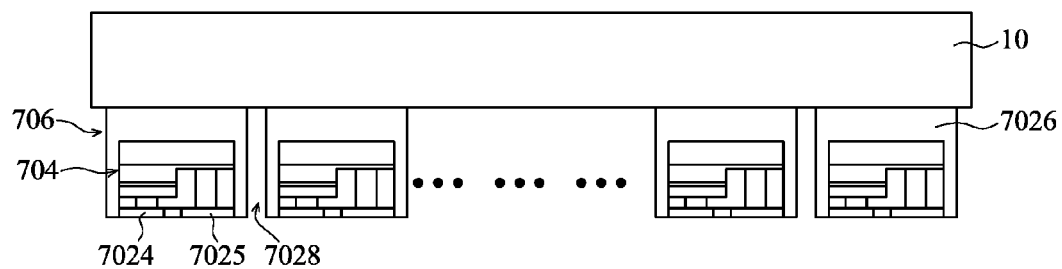

Thereafter, as shown in FIG. 8E, a plurality of trenches 7027 is formed between and to separate two adjacent ones of the light-emitting structures 704 in the transparent structure 7026 such that a plurality of light-emitting structures 706 is formed on the first carrier 10. The trench 7027 can have a triangular, linear, or curved cross section such that the light-emitting structures 706 can have the transparent structure 7026 with different shape.

Figure 8F:
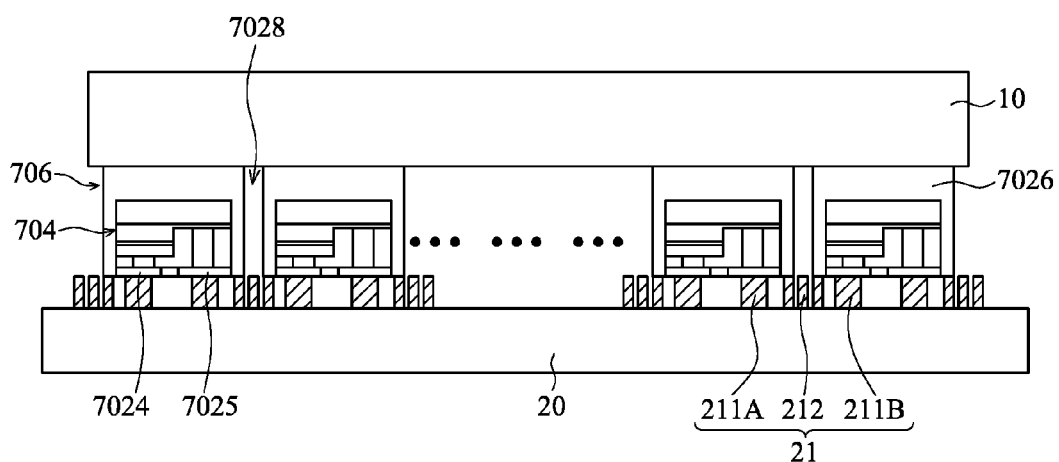
Figure 8G:
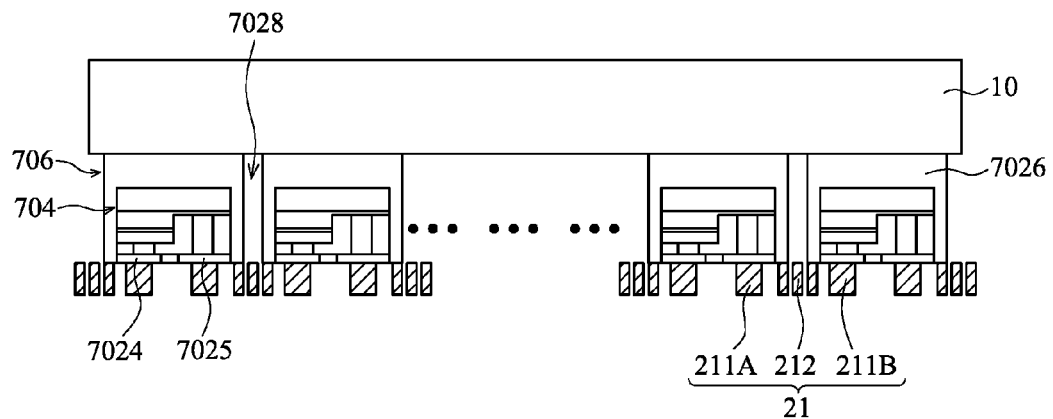
Figure 8H:
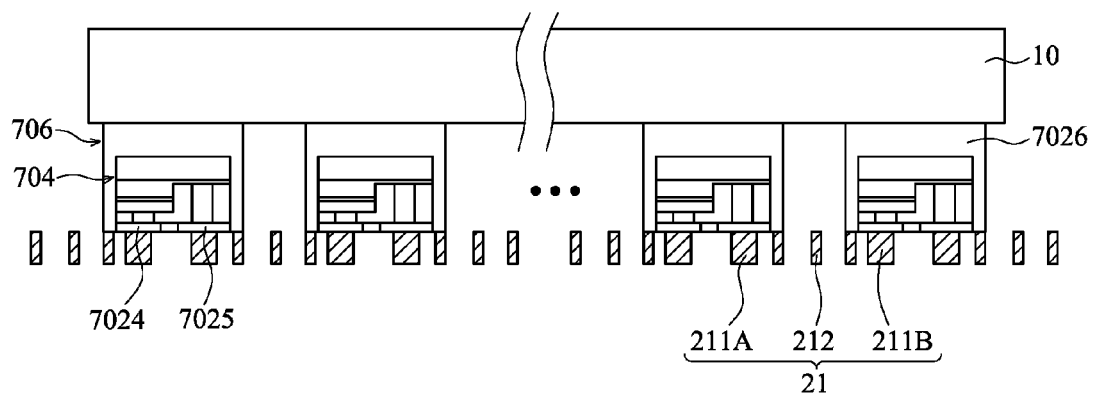
Figure 8I:
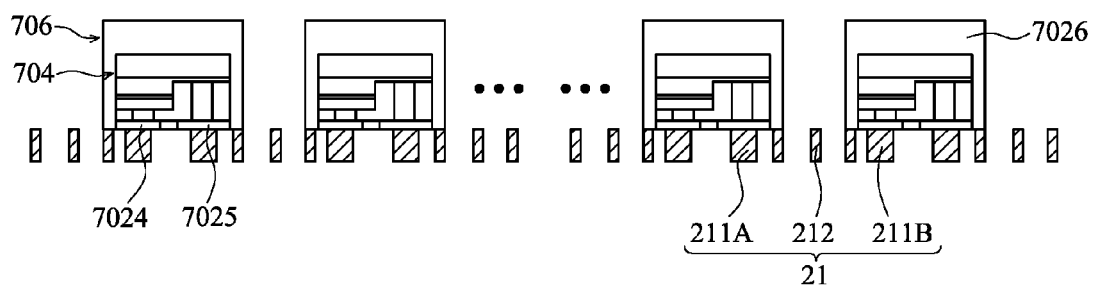
Figure 8J:
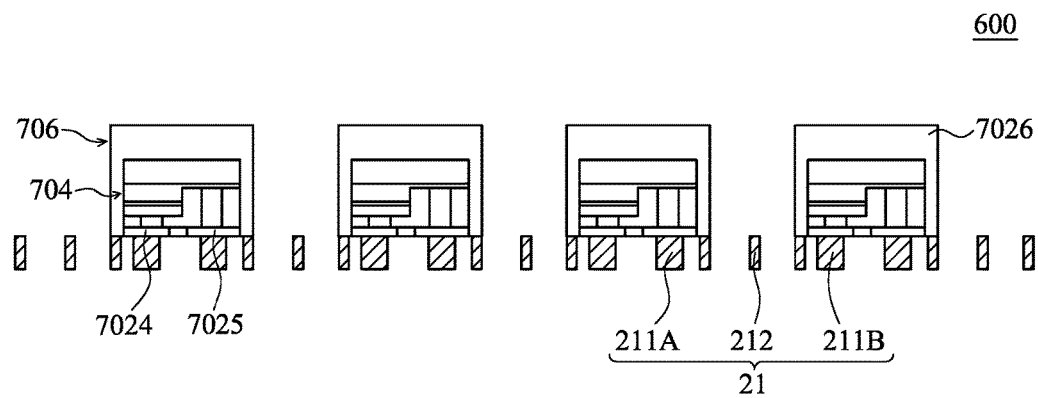

In FIG. 8F, a second carrier 20 is also provided. A plurality of conductive structures 21 is formed on the second carrier 20. The process of FIG. 8F can be referred to FIGS. 4A and 4B. Devices or elements with similar or the same symbols represent those with the same or similar functions. Likewise, the process of of FIGS. 8G-8J can correspond to FIGS. 4C-4F.

Figure 9:
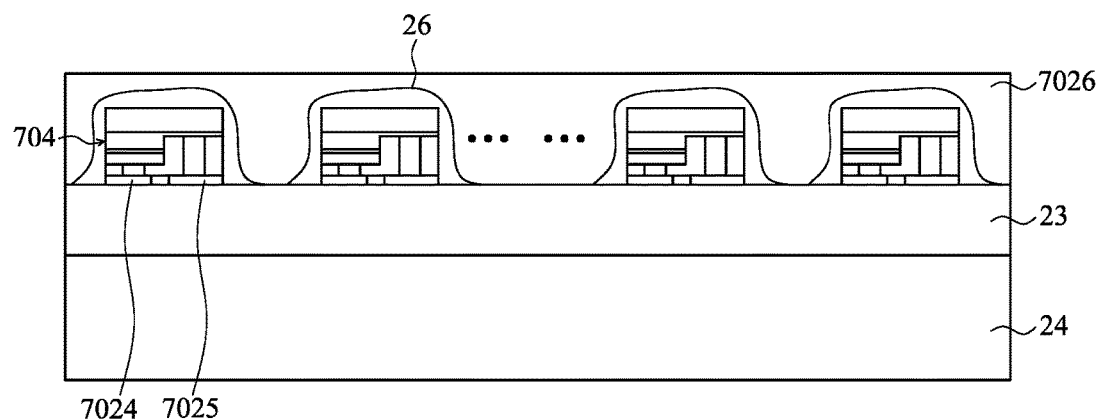
FIG. 9 is a cross-sectional view, wherein a wavelength conversion layer is disposed within a transparent structure.

Alternatively, an addition step of FIG. 9 can be added before the step of FIG. 8C, that is, a wavelength conversion layer 26 can be further disposed within the transparent structure 7026 to convert a first light emitted from the light-emitting structure 704 to a second light. The wavelength conversion layer 26 has a curved profile in cross section and substantially covers five sides of the light-emitting structure 704 except the surface with the electrodes. The wavelength conversion layer 26 can includes one or more kinds of wavelength conversion material dispersed in a matrix. The matrix includes silicone and epoxy. The first light is mixed with the second light to produce a white light with a color temperature of 2000K-6500K (such as 2000K, 2200K, 2400K, 3000K, 3500K, 4000K, or 6500K). The color temperature is measured while the light-emitting structure is operated at an initial state or at a thermal steady state. In another embodiment, the wavelength conversion layer 26 is a pre-made phosphor sheet and attached to the light-emitting structure 704 by a hot pressing method.

Figure 10A:
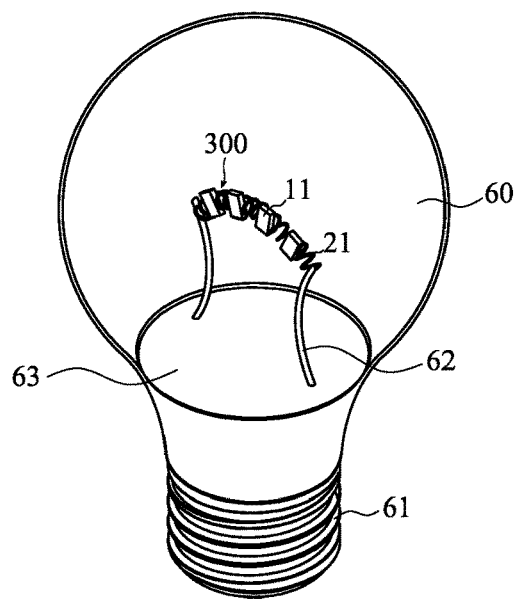
FIG. 10A is a perspective view of the light-emitting device disposed in a lamp in accordance with one embodiment of the present disclosure.

FIG. 10A is a perspective view of the light-emitting device 300 disposed in a lamp in accordance with one embodiment of the present disclosure. The lamp comprises the light-emitting device 300, a cover 60, an electrical connector 61, two supporting leads 62 and a board 63 electrically connected to the electrical connector 61. The light-emitting device 300 comprises a plurality of light-emitting structures 11 and the conductive structure 21. The light-emitting device 300 can be electrically connected to the two supporting leads 62 through adhering or soldering the conductive structure 21 thereon. The supporting leads 62 are mounted and electrically connected to the board 63. Therefore, when the electrical connector 61 is connected to a power supply, the light-emitting device 300 can emit light. In this embodiment, since the light-emitting device 300 is without any carrier, each of the light-emitting structures 11 has six surfaces directly exposed to the ambient environment (for example, air or gas filled within the cover 60). Heat produced from the light-emitting device 300 can be dissipated away through the supporting leads 62 or ambient air. The supporting lead 62 comprises metal such as Cu, Ag, Al, Au, Pt or Ni.

Figure 10B:
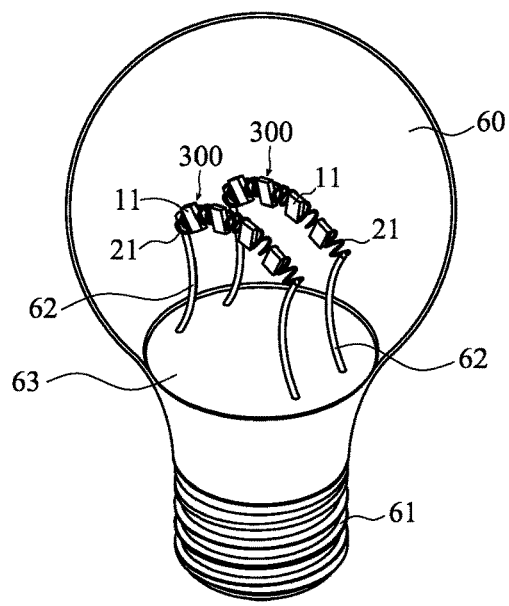
FIG. 10B is a perspective view of the light-emitting device disposed in a lamp in accordance with one embodiment of the present disclosure.

FIG. 10B is a perspective view of the light-emitting devices 300 disposed in a lamp in accordance with one embodiment of the present disclosure. Similar to FIG. 10A, in this embodiment, two light-emitting devices 300 are disposed within the cover 60 and arranged in two rows. The light-emitting devices 300 are electrically connected to the supporting leads 62, and can be connected with each other in series or in parallel through a circuit within the electrical connector 61 or on the board 63.

Figure 10C:
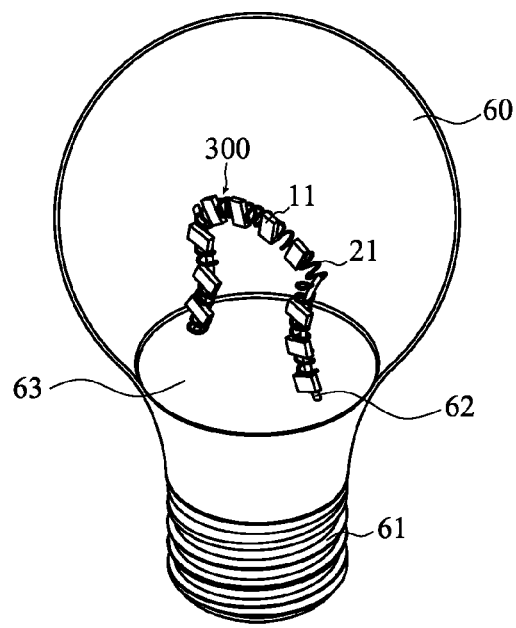
FIG. 10C is a perspective view of the light-emitting device disposed in a lamp in accordance with one embodiment of the present disclosure.

FIG. 10C is a perspective view of the light-emitting device 300 disposed in a lamp in accordance with one embodiment of the present disclosure. The light-emitting device 300 can be further wound on the supporting leads 62. To avoid a short circuit between the light-emitting device 300 and the supporting leads 62, an electrical insulation structure (not shown) is provided between the light-emitting device 300 and the leads 62.

In one embodiment, the supporting leads 62 can be sleeved by the electrical insulation structure. The light-emitting device 300 is wound on the electrical insulation structure and electrically connected to a portion of the leads 62 uncovered by the electrical insulation structure.

Figure 10D:
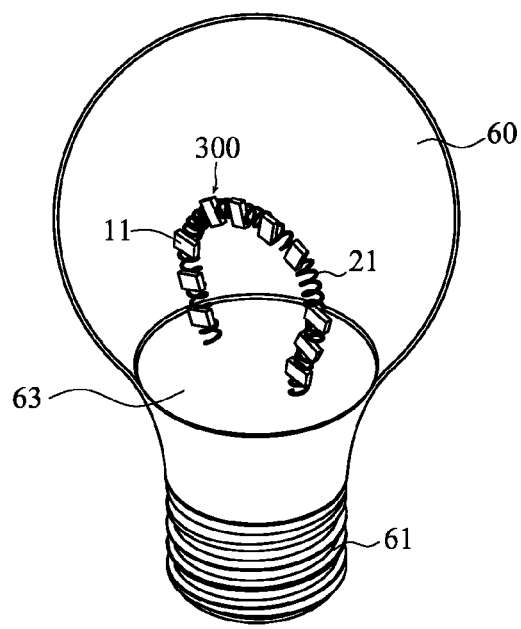
FIG. 10D is a perspective view of the light-emitting device disposed in a lamp in accordance with one embodiment of the present disclosure.

As shown in FIG. 10D, the light-emitting device 300 is directly and electrically connected to the board 63 or the electrical connector 61 without an aid of any leads. The light-emitting device 300 can be bended or formed into a triangular-like shape, a rectangular shape, a circular shape or other shape.

The quantity and the arrangement of the light-emitting devices can be varied depending on actual requirements (for example: intensity, voltage, CRI, or CCT). In addition, the aforesaid light-emitting device 100, 200, 300, 400, 500, 600 can be applied to many kinds of lamp (such as A bulb, B bulb, PAR, capsule lamp, tube, or other lighting fixture (troffer)). Additionally, the light-emitting device 100, 200, 300, 400, 500, 600 can also be used in a backlight for a display.

Figure 11A:
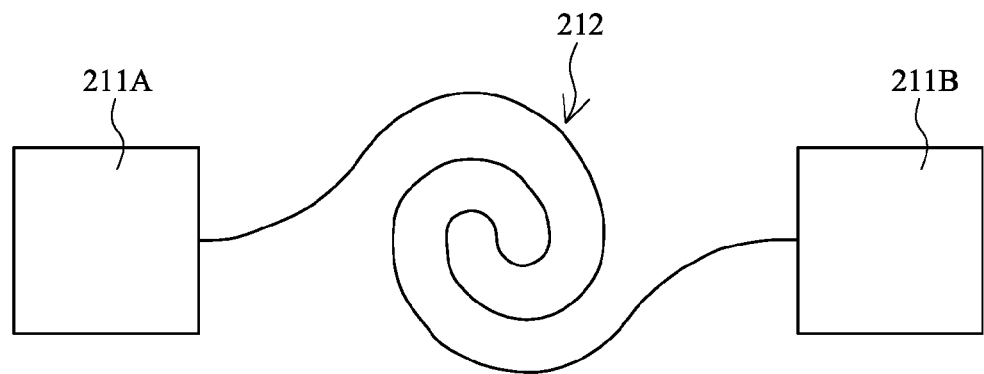
FIGS. 11A-11F shows top views of a conductive structure with different shapes.
Figure 11B:
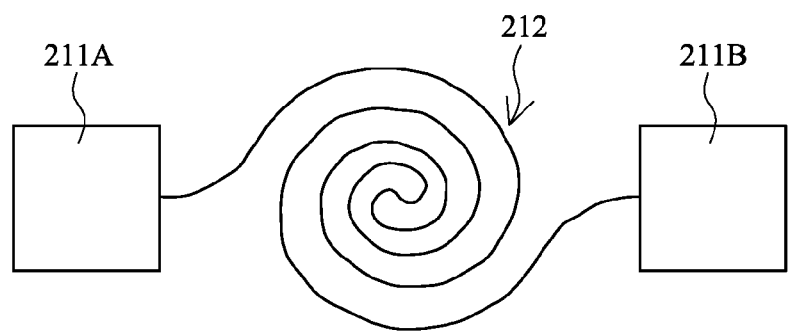
Figure 11C:
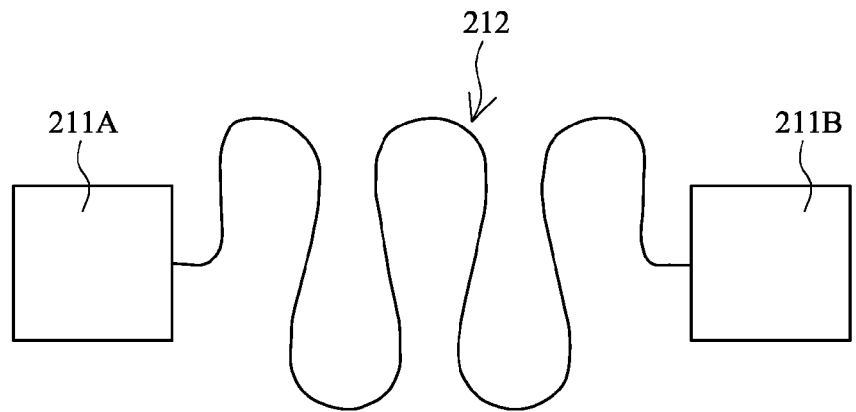
Figure 11D:
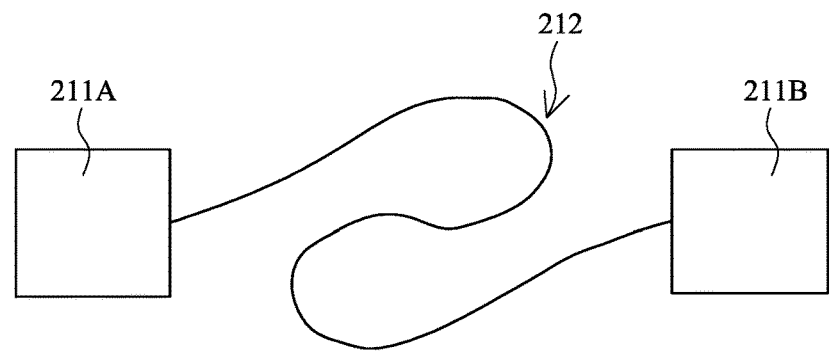
Figure 11E:
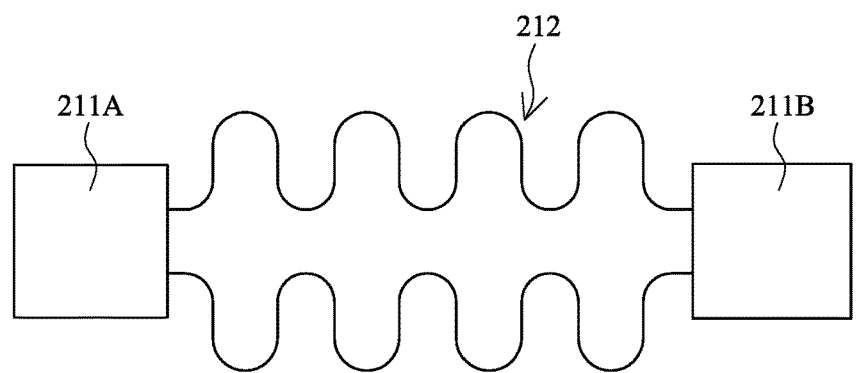
Figure 11F:
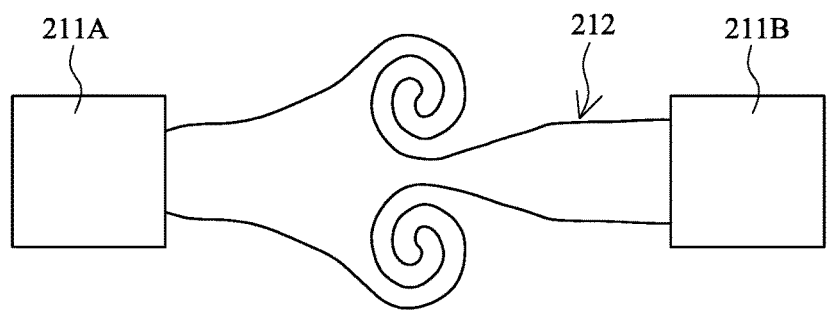

FIGS. 11A-11F shows top views of one conductive structure 21. The connecting portion 212 can be curve, spiral, linear or other shape. As shown in FIGS. 11A and 11B, the connecting portion 212 has a spiral-like shape. FIG. 11C shows the connecting portion 212 which is curved and has five bending portions. FIG. 11D shows the connecting portion 212 which is curved and has two bending portions with an S-like shape. FIG. 11E shows two connecting portions 212 arranged between the first connecting pad 211A and the second connecting pad 211B. The two connecting portions 212 are symmetric to each other. Each connecting portion 212 has seven bending portions. Similar to FIG. 11E, FIG. 11F also shows two connecting portions 212 arranged between the first connecting pad 211A and the second connecting pad 211B. The two connecting portions 212 are symmetric to each other. Each connecting portions 212 has a spiral-like shape.

Figure 12A:
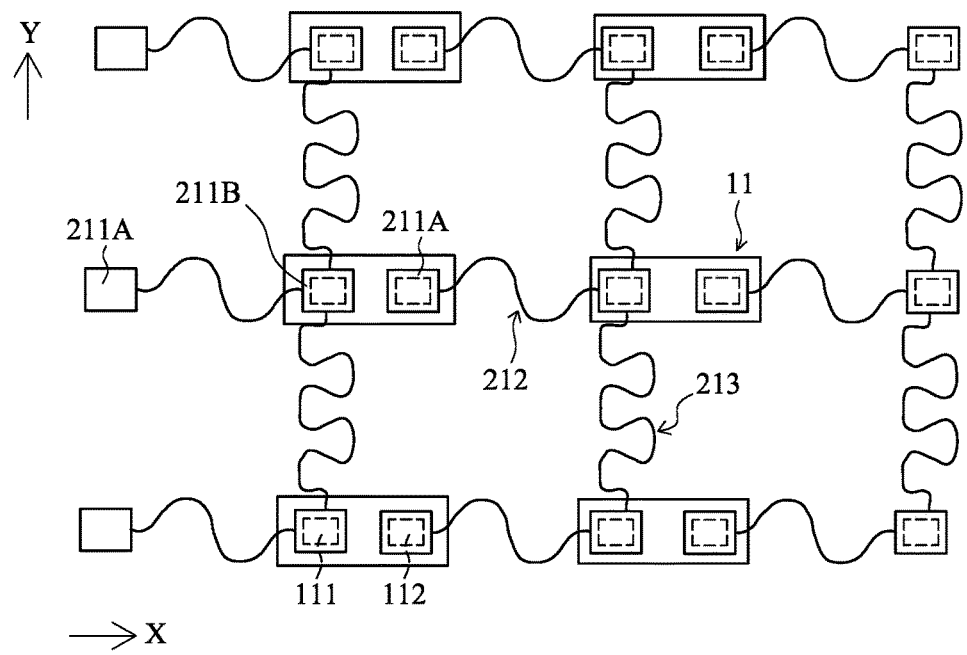
FIG. 12A is a top view showing a portion of the conductive structures arranged in a net form in accordance with one embodiment of the present disclosure.

FIG. 12A is a top view of showing a portion of the conductive structures 21 and the light-emitting structures 11 in accordance with one embodiment of the present disclosure. The conductive structures 21 of FIG. 12A is arranged in a net form, compared to FIG. 2A which shows the conductive structures 21 arranged in a first direction (X) or in one dimension. In this embodiment, a plurality of the conductive structures 21 is arranged in parallel and a plurality of interconnections 213 connects the second connecting pad 211B of different conductive structures 21. Specifically, the connecting portion 212 physically and electrically connects the first connecting pad 211 and the second connecting pad 211B of different conductive structures 21 in the first direction (X); and the interconnection 213 physically and electrically connects the second connecting pads 211B of different conductive structures 21 in a second direction (Y). The interconnections 213 is made of a material same as the conductive structures 21. In addition, the conductive structures 21 and the interconnections 213 are in a first state which is in a non-stretched state.

Figure 12B:
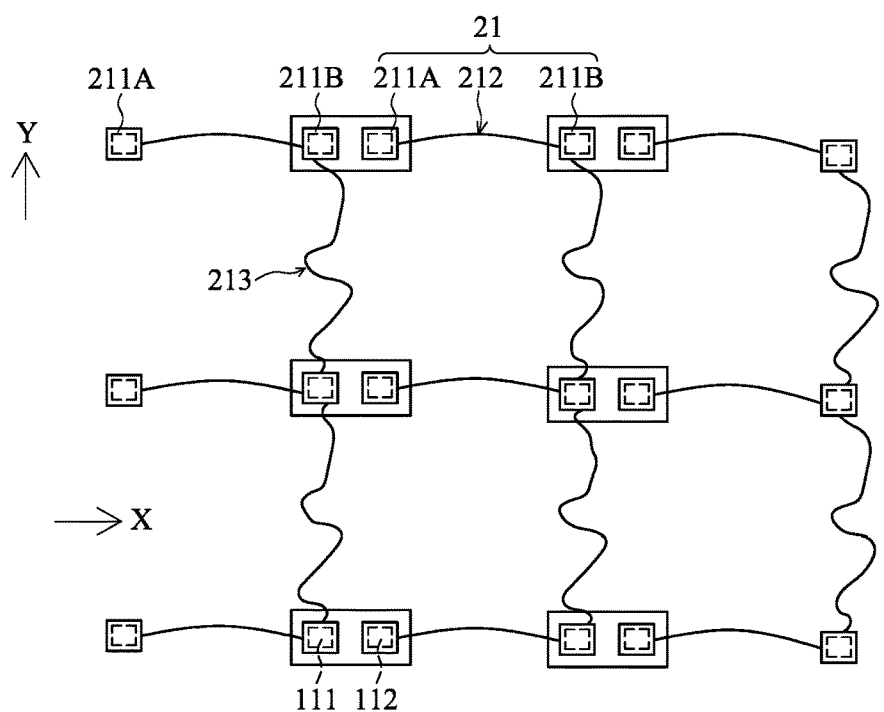
FIG. 12B is a top view showing the conductive structures of FIG. 12A in a stretched state.
Figure 12C:
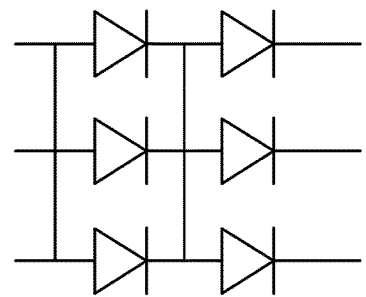
FIG. 12C shows an equivalent circuit of FIG. 12B.

FIG. 12B is a top view showing the conductive structures 21 in the second state which is a stretched state. Likewise, the connecting portion 212 and the interconnections 213 are stretched and a distance or pitch between the light-emitting structures 11 is enlarged. In this embodiment, the interconnections 213 are not separated such that the light-emitting structures 11 are in a series-parallel connection and a light-emitting net is formed. FIG. 12C shows an equivalent circuit of FIG. 12B. The light-emitting net can be used a backlight for a display.

Figure 12D:
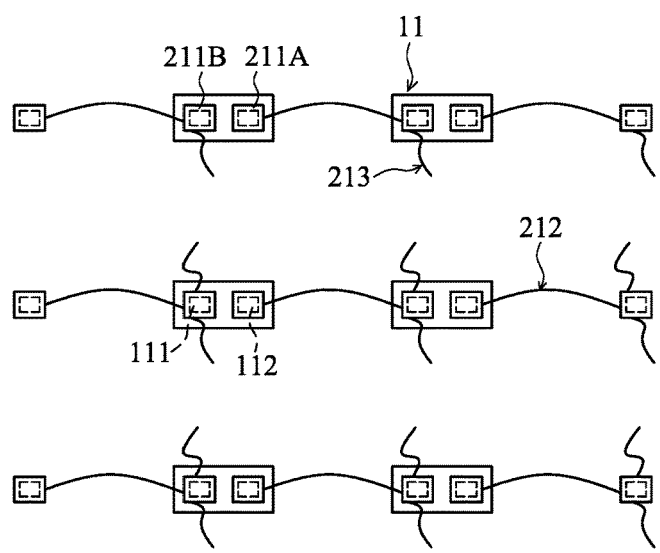
FIG. 12D shows a top view of a plurality of light-emitting device formed after cutting interconnections of FIG. 12A.
Figure 12E:
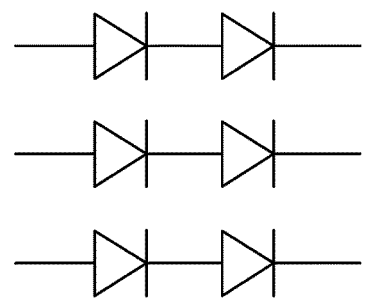
FIG. 12E shows an equivalent circuit of FIG. 12D.

In one embodiment, as shown in FIG. 12D, after stretching, the interconnections 213 are cut to form a plurality of light-emitting devices where the light-emitting structures 11 are electrically connected in series with each other. FIG. 12E shows an equivalent circuit of FIG. 12D.

As shown in FIGS. 1A and 2A (for example), the conductive structure 21 is formed on the second carrier 20 which is a two dimension structure. When the second carrier 20 is removed (see FIG. 1C) and the conductive structure 21 is stretched (see FIG. 1D), the conductive structure 21 may has a three dimension structure.

The foregoing description has been directed to the specific embodiments of this invention. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device comprising:
a first light-emitting structure having an active layer;
a second light-emitting structure;
a third light-emitting structure;
a transparent material enclosing the first light-emitting structure, the second light-emitting structure, and the third light-emitting structure;
a first conductive structure overlapping the active layer in a cross-sectional view, and having a first connecting pad connected to the first light-emitting structure, a second connecting pad connected to the second light-emitting structure, and a connecting portion suspended in the transparent material; and
a second conductive structure not overlapping the first conductive structure, and connecting the second light-emitting structure with the third light-emitting structure,
wherein the second light-emitting structure is electrically arranged between the first light-emitting structure and the third light-emitting structure, and
wherein the first connecting pad the second connecting pad, and the connecting portion are formed by a same material.

2. The light-emitting device of claim 1, wherein the second conductive structure has a portion suspended in the transparent material.

3. The light-emitting device of claim 1, further comprising a structure having a first surface and a second surface facing and separated from the first surface, wherein the first light-emitting structure and the second light-emitting structure are arranged between the first surface and the second surface.

4. The light-emitting device of claim 3, further comprising a third conductive structure connected to the first light-emitting structure and having a portion extending beyond an edge of the structure.

5. The light-emitting device of claim 3, wherein the first conductive structure is devoid of a direct contact with the first surface and the second surface.

6. The light-emitting device of claim 1, wherein the connecting portion has a top surface and a bottom surface opposite to the top surface, the top surface and the bottom surface directly contact the transparent material.

7. The light-emitting device of claim 1, further comprising a wavelength conversion material arranged in the transparent material.

8. The light-emitting device of claim 1, wherein the connecting portion is arranged between the first connection pad and the second connecting pad.

9. The light-emitting device of claim 1, wherein the connecting portion is arranged in a configuration of not overlapping the first connecting pad or the second connecting pad in a direction.

10. The light-emitting device of claim 1, wherein the connecting portion is completely embedded in the transparent material.

11. The light-emitting device of claim 1, wherein the first conductive structure is made of Cu, Au, Pt, Ti, Ni, or a combination thereof.

12. A light-emitting device comprising:
a first light-emitting structure;
a second light-emitting structure;
a first transparent material portion enclosing the first light-emitting structure without enclosing the second light-emitting structure;
a second transparent material portion enclosing the second light-emitting structure without enclosing the first transparent material portion; and
a first conductive structure electrically connecting the first light-emitting structure and the second light-emitting structure, and having a portion suspended in an ambient material,
wherein the light-emitting device is configured to arrange in a curved shape.

13. A lamp comprising:
a cover; and
a first light-emitting device of claim 12 disposed in the cover.

14. The lamp of claim 13, further comprising a supporting lead on which the light-emitting device is mounted.

15. The lamp of claim 14, wherein the first light-emitting device comprises a second conductive structure connecting the first light-emitting structure with the supporting lead.

16. The lamp of claim 13, further comprising a plurality of light-emitting devices disposed in the cover, and electrically connected to the first light-emitting device in parallel.

17. The lamp of claim 16, wherein the plurality of light-emitting devices connected to the first light-emitting device in parallel is arranged in a curved shape.

18. The lamp of claim 13, further comprising an electrical connector connected to the cover.

19. The light-emitting device of claim 1, further comprising a third conductive structure connected to the first light-emitting structure and having a portion extending beyond an edge of the transparent material.

20. The light-emitting device of claim 12, wherein the first conductive structure comprises a connecting pad connected to the first light-emitting structure and a connecting portion connected to the connecting pad and suspended in the ambient environment.

* * * * *